United States Patent [19]

Parodi et al.

[11] Patent Number: 5,651,823

[45] Date of Patent: Jul. 29, 1997

[54] CLUSTERED PHOTOLITHOGRAPHY SYSTEM

[75] Inventors: Michael L. Parodi, Alamo; Michael R. Biche, Union City; H. Alexander Anderson, Santa Cruz; Alexander Lurye, Fremont, all of Calif.

[73] Assignee: Semiconductor Systems, Inc., Fremont, Calif.

[21] Appl. No.: 412,650

[22] Filed: Mar. 29, 1995

Related U.S. Application Data

[63] Continuation of Ser. No. 93,505, Jul. 16, 1993, abandoned.

[51] Int. Cl.$^6$ ............................................. B65G 25/00
[52] U.S. Cl. ........................ 118/500; 118/503; 414/225; 414/416; 414/940; 396/624
[58] Field of Search ..................... 118/52, 500, 503; 414/222, 225, 416, 940; 354/319; 396/624

[56] References Cited

U.S. PATENT DOCUMENTS

| | | | |
|---|---|---|---|
| 762,888 | 6/1904 | Decker . | |
| 2,165,122 | 7/1939 | Ashbery | 312/20 |
| 3,854,605 | 12/1974 | Proper et al. | 214/16.4 |
| 4,280,786 | 7/1981 | Dyche | 414/749 |
| 4,604,026 | 8/1986 | Barrett | 414/728 |
| 4,683,654 | 8/1987 | Scholten et al. | 29/832 |
| 4,744,715 | 5/1988 | Kawabata | 414/331 |
| 4,842,683 | 6/1989 | Cheng et al. | 156/345 |
| 4,935,320 | 6/1990 | Rohde et al. | 430/14 |
| 4,951,601 | 8/1990 | Mayden | 118/719 |
| 4,971,515 | 11/1990 | Pol et al. | 414/797 |
| 4,975,016 | 12/1990 | Pellenc et al. | 414/501 |
| 4,985,722 | 1/1991 | Ushijima et al. | 354/319 |
| 5,048,164 | 9/1991 | Harima | 29/25.01 |
| 5,061,144 | 10/1991 | Akimoto et al. | 414/225 |
| 5,135,608 | 8/1992 | Okutani | 156/643 |
| 5,171,393 | 12/1992 | Moffat | 156/345 |
| 5,176,783 | 1/1993 | Yoshikawa | 156/345 |
| 5,180,276 | 1/1993 | Hendrickson | 414/752 |
| 5,193,972 | 3/1993 | Engelbrecht | 414/754 |
| 5,202,716 | 4/1993 | Tateyama et al. | 354/319 |
| 5,364,222 | 11/1994 | Akimoto et al. | 414/416 |

FOREIGN PATENT DOCUMENTS

| | | |
|---|---|---|
| 0253162A3 | 1/1988 | European Pat. Off. . |
| 0435568A3 | 7/1991 | European Pat. Off. . |
| 0462459A1 | 12/1991 | European Pat. Off. . |
| 922144 | 12/1945 | France ............ 18/1 |
| WO91/19316 | 12/1991 | WIPO . |

OTHER PUBLICATIONS

Korolkoff, Nicholas O., "Integrated Processing Part II —Cluster Tool Systems", *Solid State Technology*, vol. 33, No. 10, Oct. 1990, pp. 82–90.

Lovell, Anthony M., et al., "Cell Automation; Integrating Manufacturing With Robotics", *Solid State Technology*, vol. 33, No. 12, Dec. 1990, pp. 37–39.

*Primary Examiner*—Jeffrey Snay
*Attorney, Agent, or Firm*—Skjerven, Morrill, MacPherson, Franklin & Friel; David E. Steuber; Omkar K. Suryadevara

[57] ABSTRACT

A substrate photolithography system includes a substrate handling robot which pivots about a fixed point and transfers substrates between photoresist coater, a developer, and a heating/cooling unit, all of which are clustered about the robot. The end effector of the robot is capable of both vertical and lateral movement so that individual modules of the heating/cooling unit may be stacked. An apparatus and a method for baking and cooling silicon substrates are disclosed. Both baking and cooling of silicon substrates are done in a single integrated thermal process module. Each thermal process module includes two hot plate assemblies, a cool plate assembly, two local linear transfer arms and a micro-processor based module controller. Both transfer arms are capable of transferring substrates among the cool and hot plate assemblies. A cassette input/output unit handles cassettes which contain semiconductor wafers or other substrates that are to be delivered to or withdrawn from a semiconductor processing system. The input/output unit includes a drawer front which rotates 90° about a horizontal axis as it is opened.

23 Claims, 32 Drawing Sheets

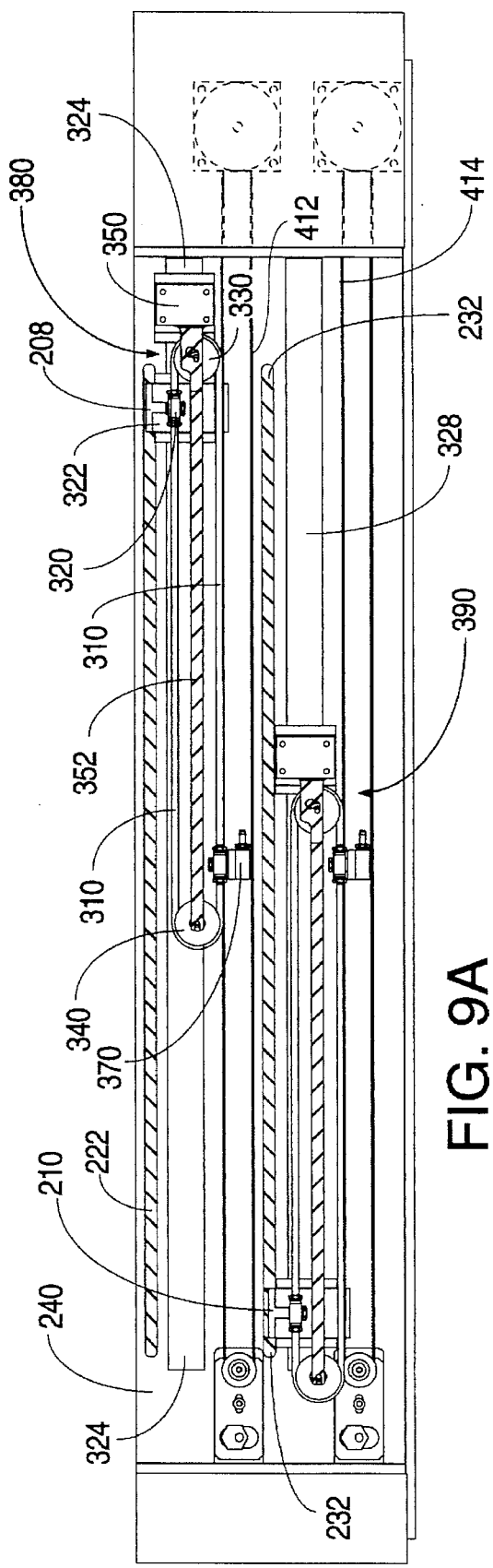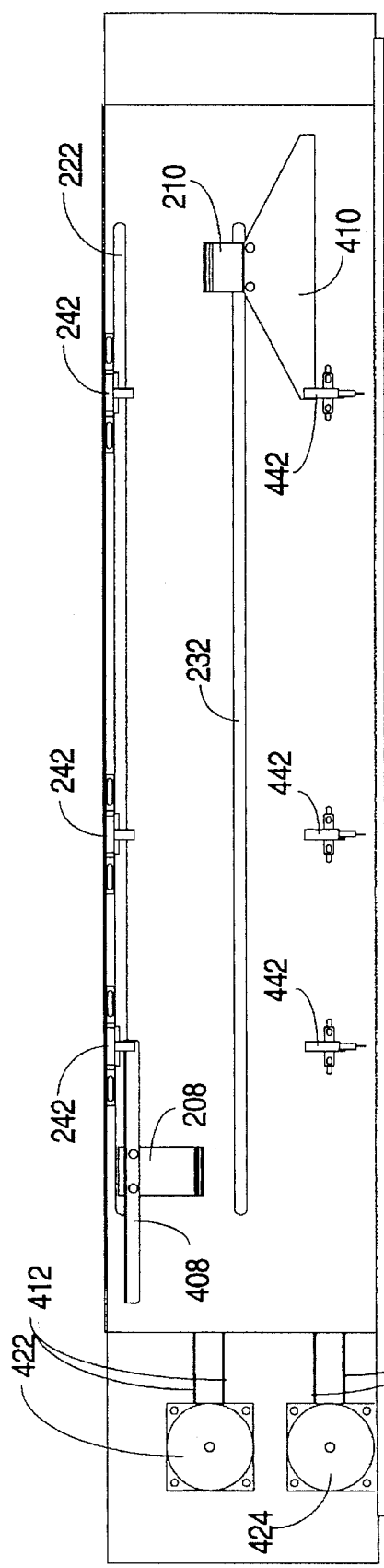
FIG. 9A
FIG. 9B

CLUSTERED PHOTOLITHOGRAPHY SYSTEM

CROSS REFERENCE TO RELATED APPLICATIONS

This application is continuation of U.S. application Ser. No. 08/093,505 entitled "CLUSTERED PHOTOLITHOGRAPHY SYSTEM" filed Jul. 16, 1993, now abondoned. This application is also related to U.S. applications Ser. No. 08/092,842, now U.S. Pat. No. 5,443,348, and 08/093,250 both filed Jul. 16, 1993.

FIELD OF THE INVENTION

This invention relates to photolithography systems and, in particular, a system for handling substrates in the course of applying a layer of a liquid material such as photoresist, polyimide or spun on glass, and developing the layer to form a mask on the surface of the substrate.

BACKGROUND OF THE INVENTION

The process by which a photoresist mask is formed on a semiconductor wafer involves first coating the wafer with a thin layer of photoresist and then exposing the photoresist with the desired pattern. The photoresist layer is then developed. This involves a number of heating and cooling steps. In a typical process, the clean wafer is subjected to a dehydration bake at 100°–150° C. to remove any moisture that has accumulated and thereby promote the adhesion of photoresist to the wafer. In addition, a chemical such as hexamethyldisilazane (HMDS) may be used at this point to improve adhesion between the photoresist and the wafer. A thin layer of photoresist is then applied to the wafer by spinning. The wafer is subjected to a "soft" bake at 90°–120° C. to create a firm bond with the photoresist and dry the photoresist by driving off any photoresist solvents. The wafer can then be transferred to the exposure system.

After the photoresist has been exposed, the wafer is subjected to a post-exposure bake at 60°–120° C. to solidify the pattern, and the photoresist is then developed, forming a pattern on the surface of the wafer. Following the developing step, the wafer is subjected to a "hard" bake at 130°–160° C. to dry the wafer and increase the adhesion of the photoresist to the silicon surface. After each of the foregoing baking steps, the wafer is cooled to 18°–25° C. in order to assure a uniform process.

All of these steps must be performed in a clean room which is temperature and humidity controlled and substantially free of dust and other particulate matter. At present, the most common system for performing this process uses a track to transport the wafer to successive stages of the process. Track systems have limited flexibility, since the wafers are locked in a fixed order. In a less common type of arrangement, various processing modules are positioned on either side of a central track, and the wafers are transported from module to module by a robot which moves back and forth along the central track. Such an arrangement is extremely wasteful of floor area since no processing occurs in the central track area. In addition, the throughput of this arrangement is limited by the speed with which the robot can move from one end of the system to the other.

In addition, in these prior art systems, if a single robot arm handles all the substrates, only one substrate may be serviced at any one time. Thus if two substrates are finished baking at the same time, only one of the substrates can be removed from the hot plate. The other substrate may be overbaked.

Also, in prior art systems, since a robot arm's end effector removes substrates from a hot plate, the end effector usually heats up over a period of time. When the hot end effector picks up a room temperature substrate having a recently coated photoresist layer, the photoresist layer may be heated non-uniformly in areas touched by the end effector. This may result in the photoresist coating being thicker in areas where the substrate was heated by the end effector. A 1° C. variation in temperature can result in 20 Å variation in thickness. Such variations are unacceptable since modern substrate processing must yield coatings of uniform thickness of 0.5 micron with variations no more than approximately 10 Å.

Furthermore, in the prior art, coiled vacuum lines are often used to supply vacuum for holding substrates in position. These vacuum lines, which extend through the equipment, may get in the way of robots, belts and other moving equipment and get chewed up and broken.

Silicon wafers which are being processed in a semiconductor fabrication facility are typically held in cassettes when they are not undergoing processing. A standard cassette has been adopted according to specifications issued by the Semiconductor Equipment Manufacturers Institute (SEMI), and the standard cassette is used almost universally in the semiconductor industry. The cassettes containing silicon wafers must be transported from one production step to the next throughout a fabrication facility. Typically, these cassettes are carried inside plastic boxes. Once a box with a cassette arrives at a particular piece of process equipment, an operator opens the box, removes the cassette and places the cassette into the equipment.

The cassettes are positioned inside the plastic transport boxes with the "H" bar forward and the flat surfaces of the wafers oriented vertically. The force of gravity keeps the wafers seated in the cassette.

Most processing equipment requires that the cassettes be introduced into the equipment with the "H" bar down and the wafers oriented horizontally. This configuration allows the equipment to access the individual wafers for processing. Thus, when the cassette is placed into the equipment, it must be rotated after it has been removed from the transport box. This rotation is typically done by an operator grasping the cassette from the side with both hands and rotating his or her wrists 90° while placing the cassette into the equipment. The repeated rotation of the filled cassettes, which typically weigh over seven pounds, has resulted in numerous repetitive use injuries, such as carpal tunnel syndrome, among equipment operators.

The processing equipment is increasingly being automated with robots. To keep the equipment safe for operators, it must be enclosed at all times. This requirement adds to the difficulty of cassette input and output. When an operator is inserting a cassette into or removing a cassette from the equipment, for example, a barrier must separate the operator and any potentially hazardous mechanisms in the equipment. The only alternative is to shut the equipment down at these times, but doing this detracts from the production rate of the equipment. To maximize the output of processed wafers, it is important that the equipment operate continuously. This means that the equipment should not be stopped in order to change cassettes.

Thus, there is a need for a cassette input/output unit which overcomes all of these problems, i.e., avoids the need for the operator to rotate the cassette when it is inserted into the equipment, provides a safety barrier at all times which prevents the operator from inadvertently making contact with robots or other hazardous mechanisms inside the equipment, and allows the equipment to be operated without interruption while cassettes are being exchanged.

These problems are overcome in a clustered photolithography system in accordance with this invention.

SUMMARY OF THE INVENTION

In the photolithography system of this invention, a wafer handling robot is mounted in a fixed position and is surrounded by a cluster of wafer processing modules. The robot pivots about a fixed point and is capable of transporting the wafers laterally, in any direction, and vertically (i.e., in three degrees of freedom). This arrangement increases the flexibility of the system, since each wafer can be moved to or from a module when necessary, without waiting for the processing of another wafer to be completed. Moveover, since the robot is capable of transporting the wafers vertically, the modules may be stacked one above the other, thereby minimizing the floor area occupied by the system.

In a photolithography system according to this invention, the baking and cooling of semiconductor substrates is done inside an integrated thermal process module. The thermal process module is serviced by a central substrate handling robot which also services other units in the system.

Each thermal process module includes a cool plate assembly and two hot plate assemblies. The substrates are transported among the cool and hot plate assemblies inside the thermal process module by two local linear transfer arms which are built into the thermal process module. A microprocessor-based module controller ensures that there are no conflicts in use of the transfer arms or in use of the hot and cool plate assemblies. Since there are as many transfer arms as there are hot plates, a transfer arm is always available whenever a substrate is finished baking. Thus there is no danger of overbaking.

The central substrate handling robot transports the substrates from and to a thermal process module only via the cool plate assembly area of each thermal process module. Since the central robot's arm never picks up a hot substrate or transfers substrates from or to a hot plate, the robot's end effector never heats up. Thus there is no danger of localized non-uniform heating of substrates.

Finally, the vacuum tubing of the thermal process module is routed via a unique pulley arrangement to achieve a compact mounting which eliminates loose tubing.

The cassette input/output unit of this invention includes a cassette drawer and a mechanism which rotates the drawer approximately 90° about a horizontal axis when the drawer is opened by an operator. When the drawer is fully opened, the front of the drawer is essentially horizontal, and a wafer cassette may be placed on the drawer front with the wafers oriented vertically inside the cassette. At the same time, the bottom of the drawer is raised to a vertical orientation which prevents the operator from extending his or her arms into the interior of the equipment.

When the drawer is closed, it rotates into its normal position, with the drawer front oriented vertically and the drawer bottom oriented horizontally. As a result, the wafers inside the cassette are then oriented horizontally and are in position to be withdrawn from the cassette by a robot arm or other mechanism.

When the cassette has been placed into the unit and the drawer has been closed, it may be desirable to pivot the cassette about a vertical axis so that it is properly oriented with respect to a robot arm. Therefore, in a preferred embodiment, a rotation plate is provided which permits the cassette to pivot about a vertical axis thereby aligning it properly with respect to a robot arm. Also in the preferred embodiment, a clamp mechanism holds the cassette in place as soon as it is placed into the input/output unit by the operator.

Since the input/output unit of this invention prevents the operator from gaining access to the interior of the equipment, the equipment can be operated continuously. This makes it particularly advantageous to provide a plurality of input/output units, arranged vertically, horizontally, or in both directions, so that cassettes may be inserted into or withdrawn from the equipment without restricting an internal robot arm from exchanging wafers with other cassette input/output units.

BRIEF DESCRIPTION OF THE DRAWINGS

FIG. 9A illustrates a rear elevation view of the thermal process module.

FIG. 9B illustrates a front elevation view of the thermal process module.

DESCRIPTION OF THE INVENTION

This invention will be described in terms of a semiconductor wafer photolithography system, but is has wide applicability to any type of substrate photolithography system.

Figure 1:
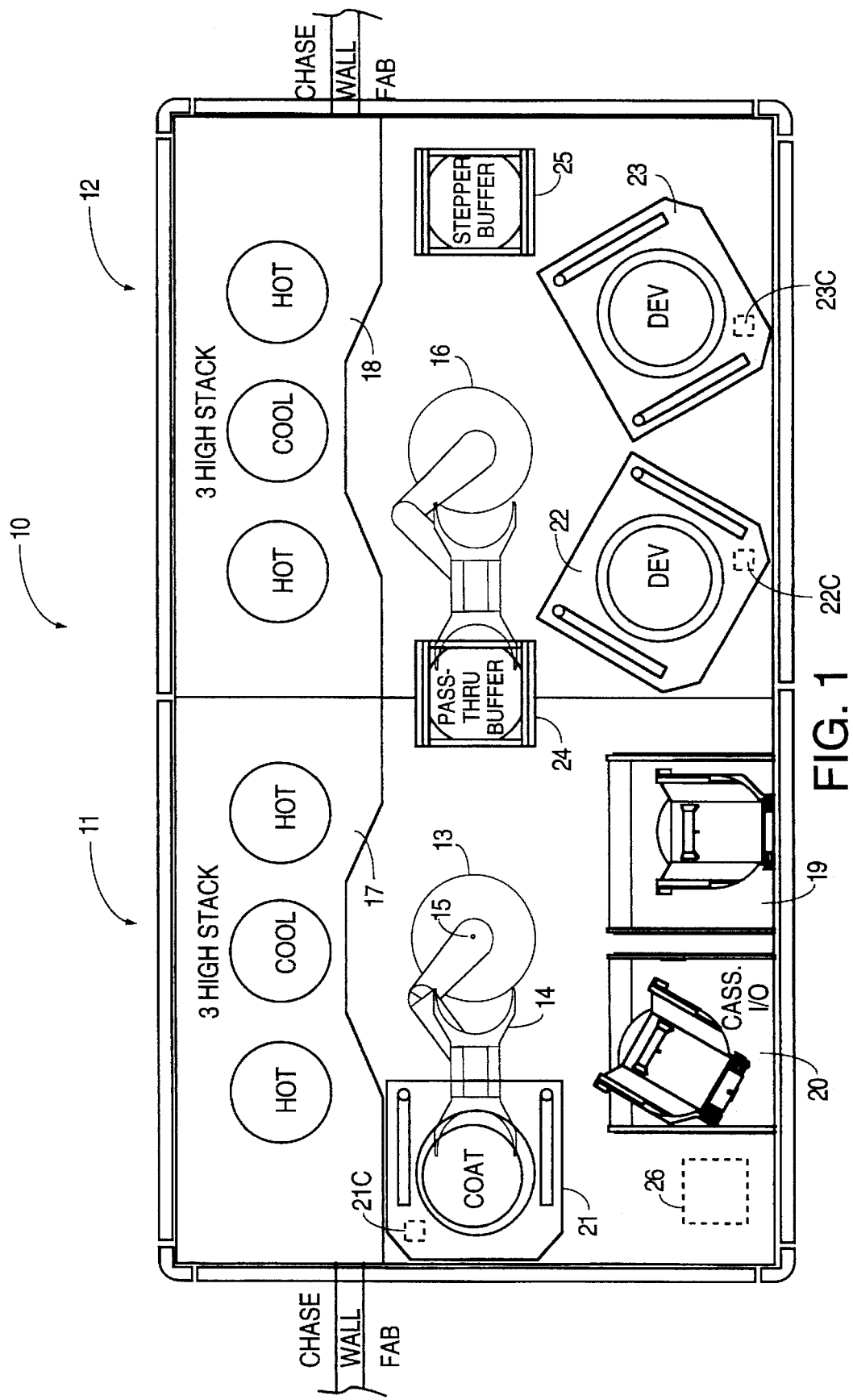
FIG. 1 illustrates a plan view of a clustered semiconductor wafer photolithography system in accordance with the invention.

FIG. 1 illustrates a plan view of a semiconductor wafer photolithography system 10 in accordance with the invention. System 10 includes a wafer coating section 11 and a wafer developing section 12. At the center of coating section 11 is a wafer handling robot 13. Robot 13, which may be the model ATM 100 manufactured by Equipe Technologies of Mountain View, Calif., is a three-degree-of-freedom robot with the ability to place wafers anywhere in a cylindrical coordinate system. It has an end effector 14 which is capable of handling two wafers simultaneously. It pivots about an axis 15 approximately at the center of coating section 11. A similar robot 16 is positioned at the center of developing section 12.

Figure 2:
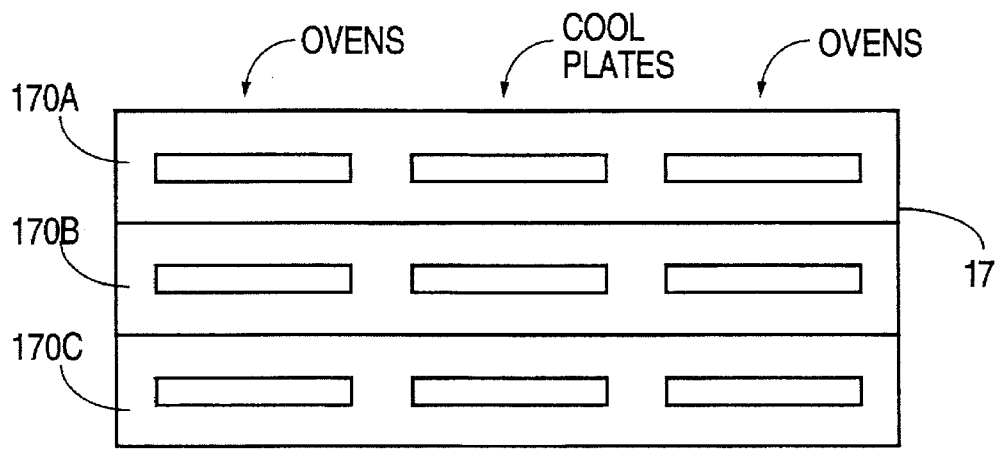
FIG. 2 illustrates a front elevational view of the heating/cooling unit.

Clustered about robots 13 and 16 are a series of processing modules. In coating section 11, a heating/cooling unit 17 contains modules 170A, 170B and 170C stacked three high. FIG. 2 illustrates an elevational view of heating/cooling unit 17. As shown in FIGS. 1 and 2, modules 170A–170C each contain a central cool plate located between two ovens. Modules 170A–170C may each be of the kind described below in reference to FIGS. 6 to 15 and also in application Ser. No. 08/093,250, co-owned and filed concurrently with 08/093,505, which is incorporated herein. A similar heating/cooling unit 18 is positioned in developing section 12.

Figure 3:
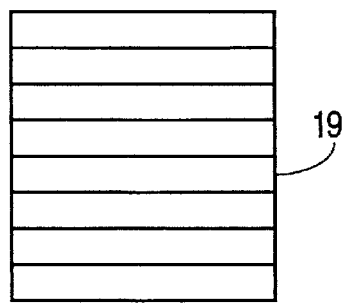
FIG. 3 illustrates a front elevational view of the wafer cassette.

Coating section 11 contains cassette input/output (I/O) units 19 and 20. Each cassette I/O unit holds a cassette containing a plurality of wafers, as shown in the elevational view of FIG. 3, and they provide the means by which wafers are introduced into and withdrawn from photolithography system 10. Cassette I/O units 19 and 20 can be moved between a retracted position (see unit 19) to an operating position (see unit 20), in the latter of which the cassette faces the axis of robot 13. Both units are accessed from the front of system 10. Cassette I/O units 19 and 20 may each be of the kind described below in reference to FIGS. 16 to 23G and also in application Ser. No. 08/092,842, co-owned and filed concurrently with 08/093,505, which is incorporated herein.

Coating section 11 contains a spin coating unit 21, and developing section 12 contains two developing units 22 and 23. A central wafer pass-through buffer 24 is provided for transferring the wafers between coating section 11 and developing section 12, and an optional stepper buffer 25 may be provided for passing the wafers to an adjacent exposure system (not shown).

The components of photolithography system 10 are controlled by a main system controller 26. Heating/cooling modules 170A–170C have individual microcontrollers (not shown). Similarly, coating unit 21 has a microcontroller 21C and developing units 22 and 23 have microcontrollers 22C and 23C, respectively. Each of these microcontrollers is connected to the system controller 26 in a master-slave relationship, and they perform such functions as actuating air cylinders, controlling motors, monitoring sensors, dispensing chemicals, etc. The system controller 26 issues high level commands to and receives high level status information from the individual microcontrollers.

The manner of operation of system 10 depends on the particular processing sequence used and will be apparent to those skilled in the art. For example, robot 13 may initially take a wafer from cassette I/O unit 19 and transfer it to an oven in module 170A for the initial dehydration heating. When the dehydration heating is completed, the microcontroller in module 170A instructs controller 26, and robot 13 transfers the wafer from the oven to the cool plate of module 170A. When the cooling process is completed, controller 26 is again instructed, and robot 13 transfers the wafer to spin coating unit 21 where the photoresist is applied. Robot 13 then transfers the wafer from spin coating unit 21 back to an oven in heating/cooling unit 17 for a soft bake and to a cool plate for cooling.

After the coating process is completed and the wafer has been soft baked and cooled, robot 13 transfers the wafer to pass-through buffer 24, where robot 16 takes over. Robot 16 delivers the wafer to stepper buffer 25 for transfer to an external exposure unit, back to an oven in heating/cooling unit 18 for the post-exposure bake, and then to a cool plate in unit 18. This takes place under the control of a microcontroller in unit 18 and system controller 26. When the wafer has been properly cooled, it is transferred to one of developing units 22 or 23. After it has been developed, the wafer is transferred back to an oven in heating/cooling unit 18 for the "hard" bake, and then to a cool plate in heating/cooling unit 18. After the wafer has been cooled, it can be transferred via pass-through buffer 24 and robot 13 to one of cassette I/O units 19 or 20.

Figure 4:
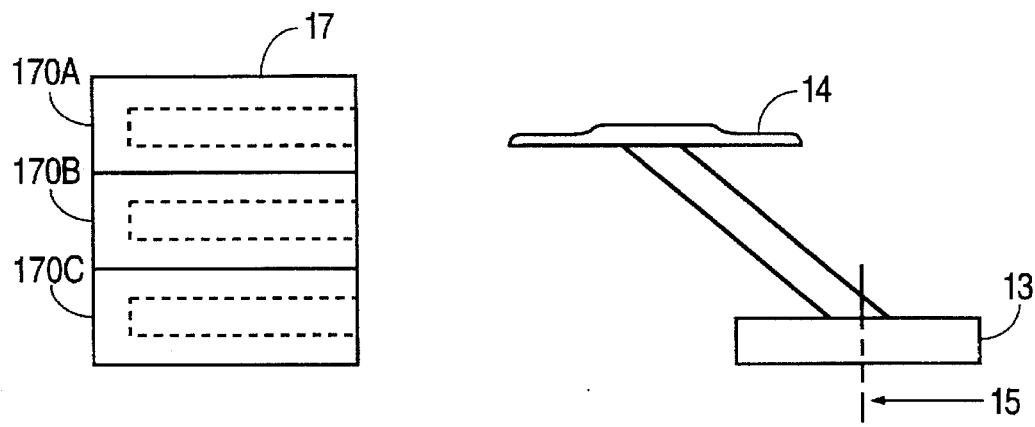
FIG. 4 illustrates a side elevational view of the heating/cooling unit and the robot.

What has been described is a very compact, cost-efficient system for coating and developing wafers. Robots 13 and 16 are three-degree-of-freedom robots instead of the relatively complex six-degree-of-freedom robots that have been used in some prior art systems. As shown in the side elevational view of FIG. 4, robot 13 can deliver or retrieve a wafer to or from the cooling section of any of the stacked modules 170A–170C in heating/cooling unit 17. Robot 16 can likewise access any of the modules in heating/cooling unit 18. The amount of "dead space" surrounding robots 13 and 16 is kept to a minimum, and the space occupied by the heating and cooling modules is likewise minimized by stacking them. In fact, one embodiment of system 10 has a total footprint of only 29.5 square feet.

Figure 5A:
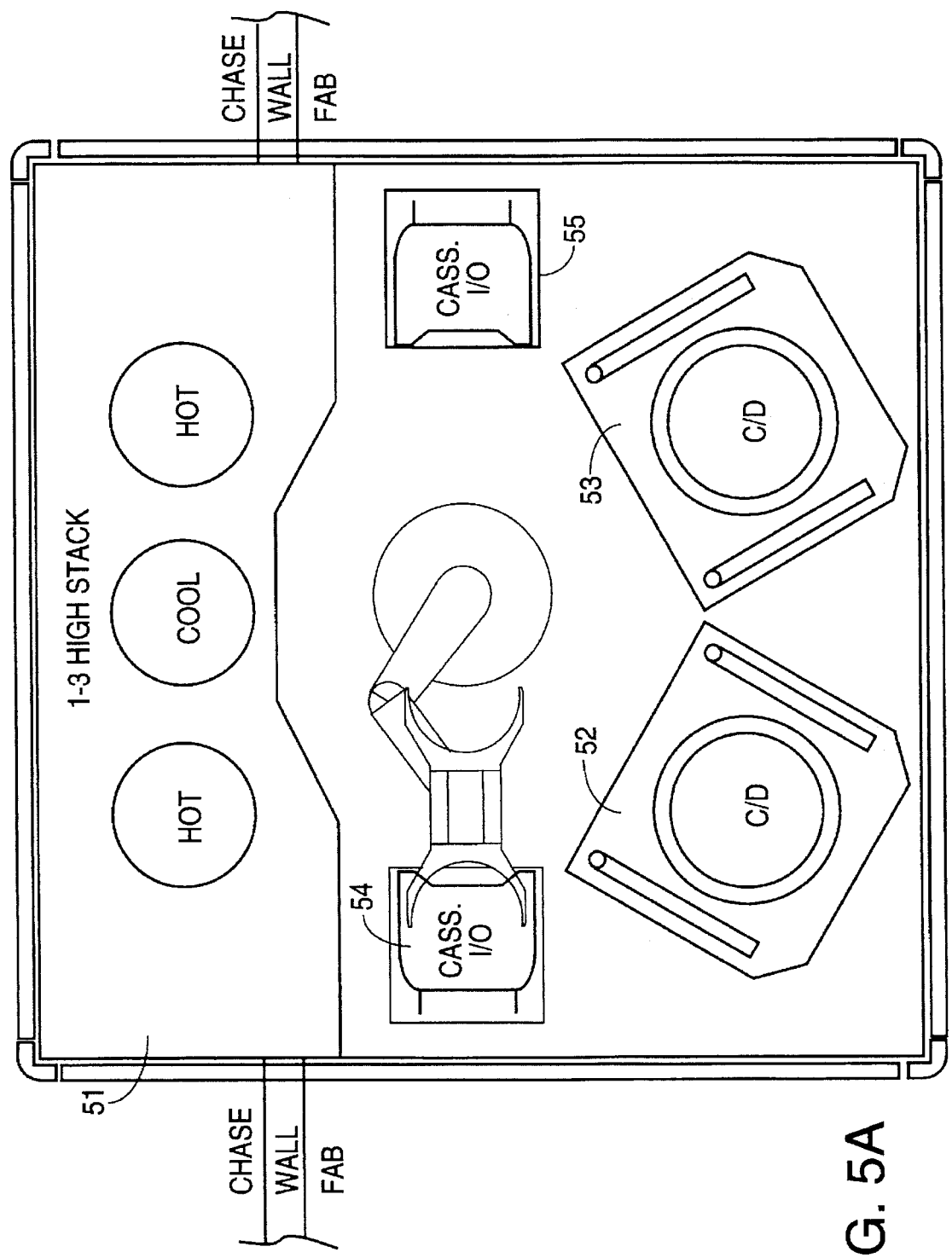
FIGS. 5A–5D illustrate plan views of alternative embodiments in accordance with the invention.
Figure 5B:
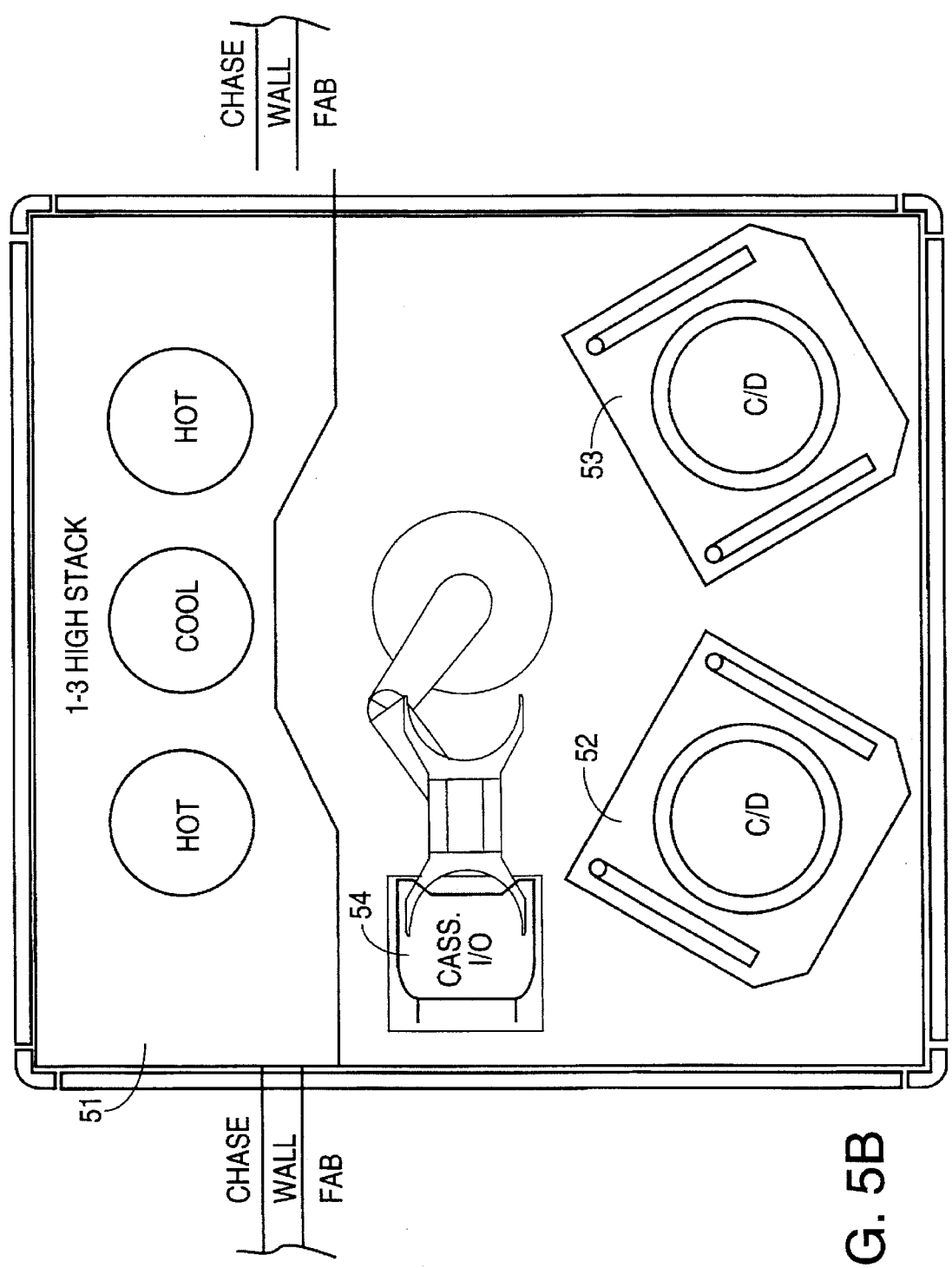
Figure 5C:
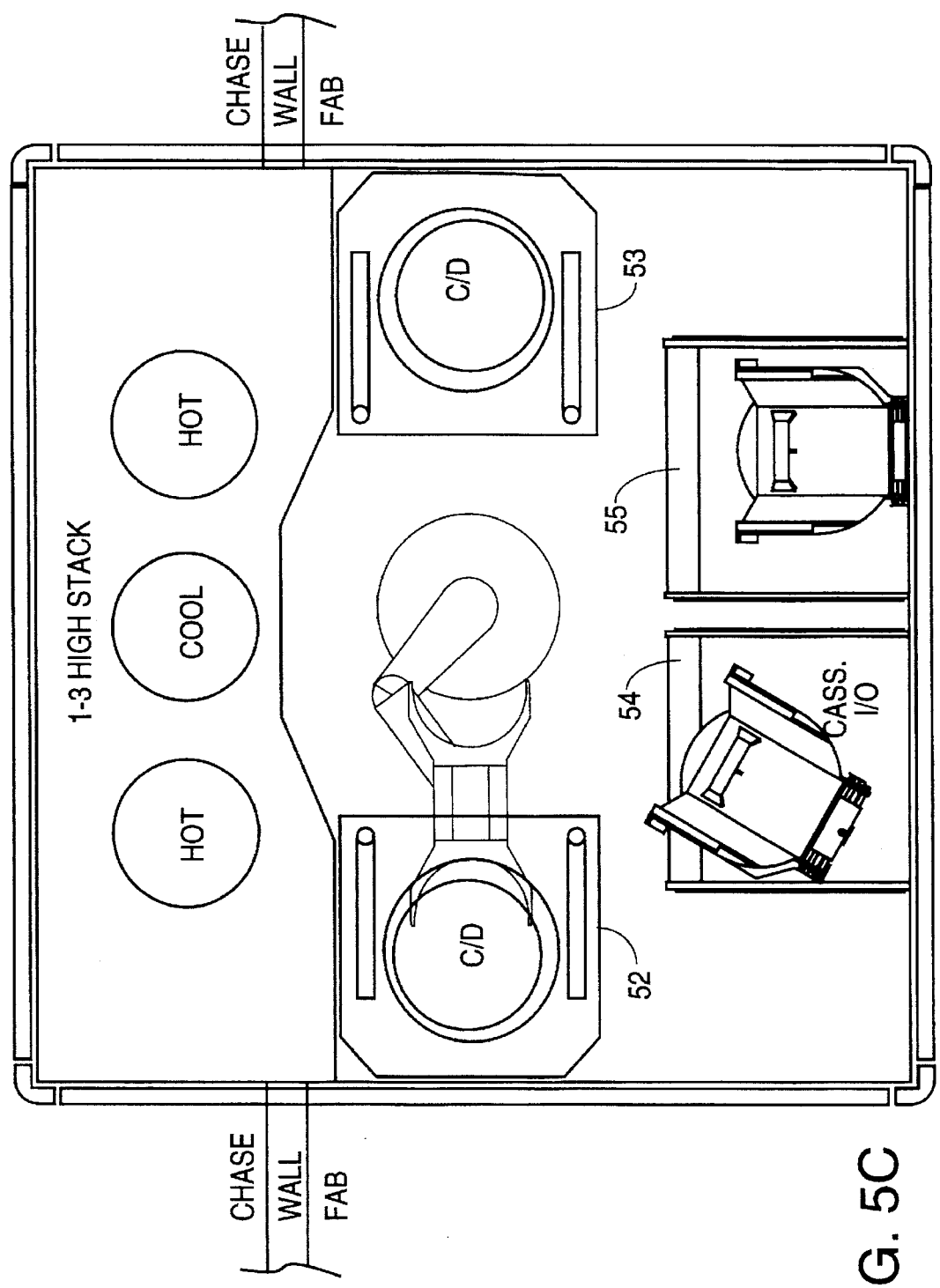
Figure 5D:
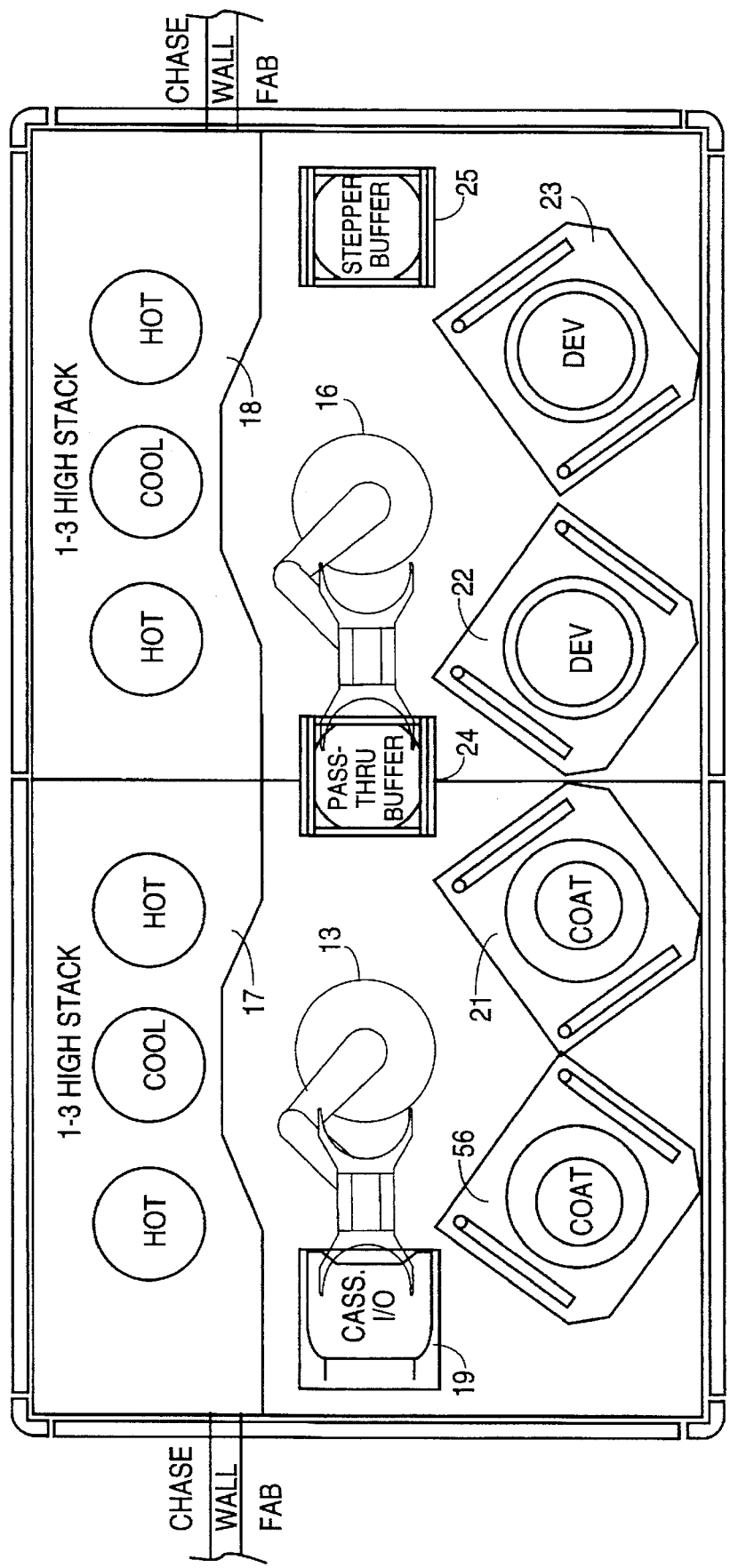

Many alternative embodiments are possible within the broad principles of this invention. Several of these alternative embodiments are illustrated in FIGS. 5A–5D. FIG. 5A illustrates a photolithography system with a single heating/cooling unit 51 and units 52 and 53 which can be either coaters or developers. In the preferred model of this embodiment, heating/cooling unit 51 includes only a single module (similar to module 170C). A pair of cassette I/O units 54 and 55 are also included. The footprint of this embodiment may be as little as 17.1 square feet. FIG. 5B illustrates a system similar to that shown in FIG. 5A except that cassette I/O unit 55 is omitted. The footprint may be as little as 15.2 square feet. FIG. 5C illustrates a system with the same components as FIG. 5A, except that the cassette I/O units 54 and 55 are positioned for front access to the system, while coater/developer units 52 and 53 are positioned on the sides. The footprint may be as little as 17.1 square feet. FIG. 5D illustrates a system similar to system 10 shown in FIG. 1, except that cassette I/O unit 20 has been replaced by a second spin coating unit 56. The footprint may be as low as 29.5 square feet.

Figure 6:
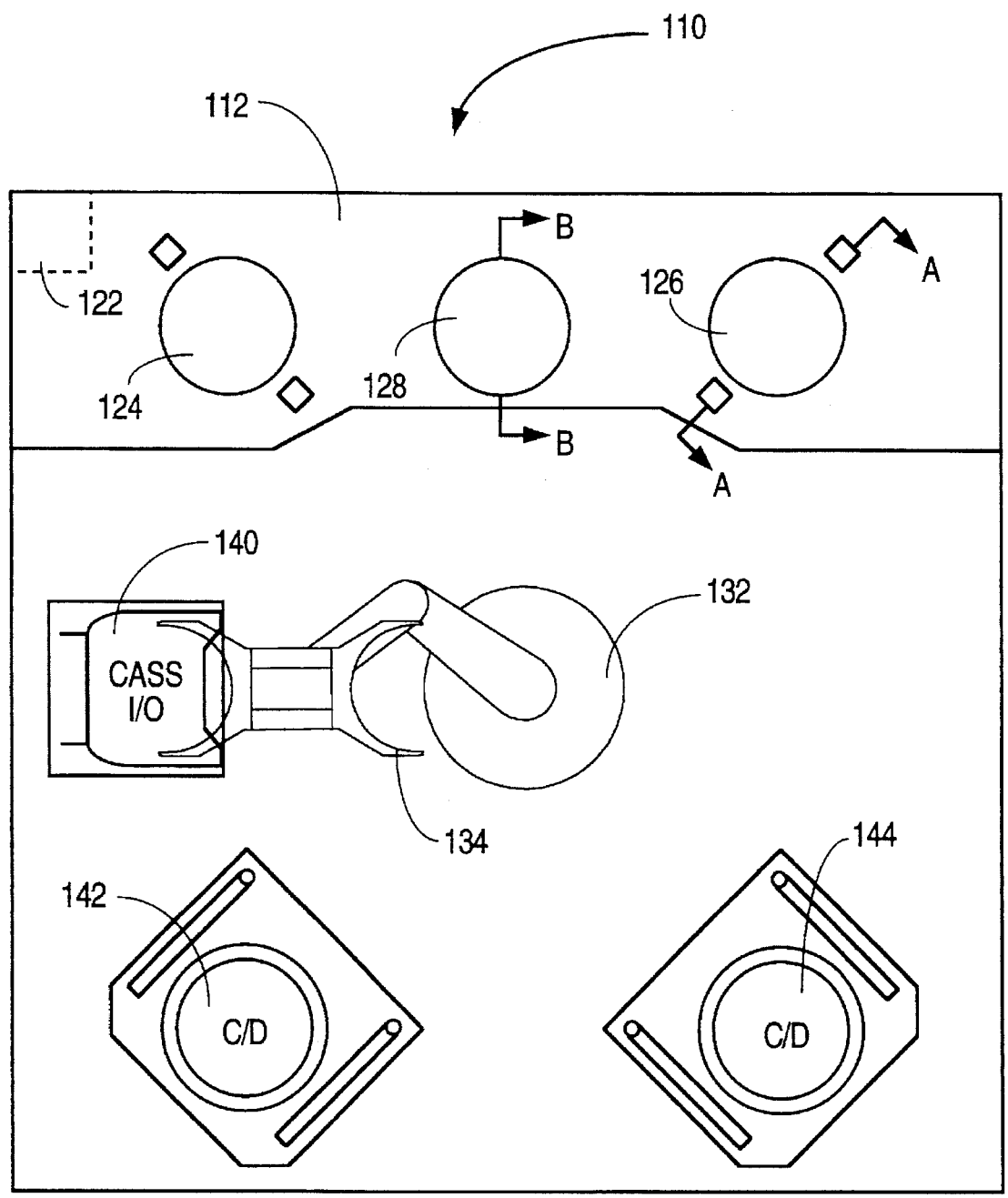
FIG. 6 illustrates a plan view of a clustered semiconductor substrate photolithography system.

FIG. 6 illustrates a plan view of a clustered semiconductor substrate photolithography system 110 of the kind described above in reference to FIGS. 1–5D. System 110 includes a thermal process module (TPM) 112 in accordance with the invention. Although only one thermal process module 112 is shown in FIG. 6, two or more thermal process modules 112 may be stacked on top of each other in system 110. Each thermal process module 112 includes a module controller 122, hot plate assemblies 124, 126 and cool plate assembly 128.

System 110 includes several components in addition to thermal process module 110. At the center of system 110 is a substrate handling robot 132. Robot 132, which may be the model ATM 100 manufactured by Equipe Technologies of Mountain View, Calif., is a simple, three-degree-of-freedom robot with the ability to place substrates anywhere in a cylindrical coordinate system. Robot 132 has an end effector 134 which is capable of handling two substrates simultaneously.

Clustered about robot 132 are a cassette input/output (I/O) unit 140, and two coating/developing (C/D) sections 142 and 144. Cassette I/O unit 140 holds a substrate cassette containing a plurality of substrates and provides the means by which substrates are introduced into and withdrawn from photolithography system 110. Coating/developing (C/D) sections 142 and 144 contain spin coating machines for coating the substrates with photoresist or developing units for developing the photoresist.

Figure 7:
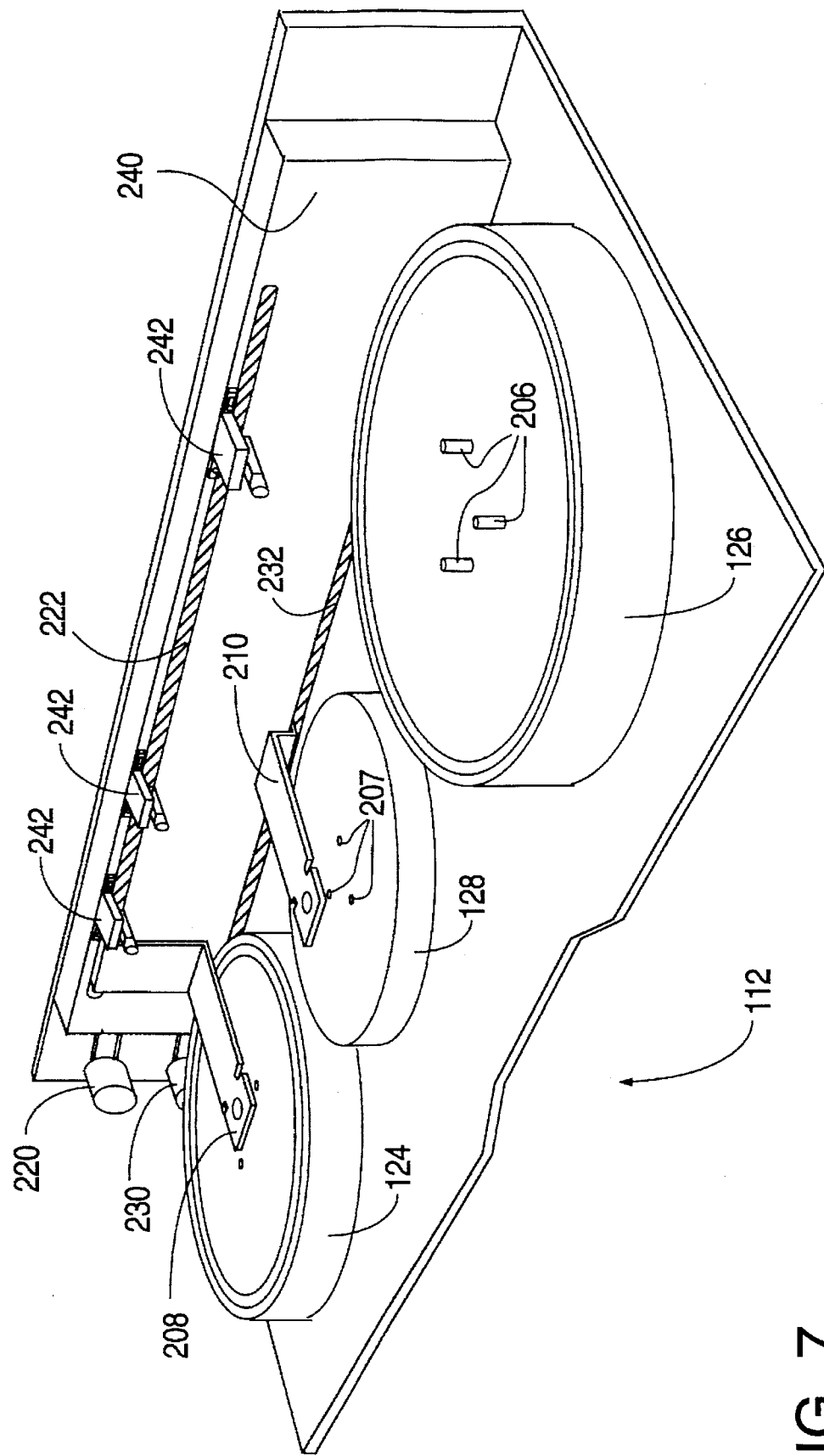
FIG. 7 illustrates a perspective view of a thermal process module in accordance with the invention.

FIG. 7 illustrates a perspective view of thermal process module 112. As shown in FIG. 7, thermal process module 112 includes two hot plate assemblies 124 and 126 and a cool plate assembly 128.

Substrates are always transferred by end effector 134 of robot 132 (FIG. 6) only to or from the cool plate assembly area of thermal process module 112. Cool plate assembly 128 as well as hot plate assemblies 124 and 126 are provided with lift pins 206 (FIG. 7) for transfer of a substrate to and from the cool plate or hot plate surface. Three lift pins 206 are provided in each assembly 124, 126, 128 to support the substrate. Lift pins 206 can be translated in the vertical direction in lift pin holes 207. In FIG. 7, lift pins 206 are shown retracted into a down position within lift pin holes 207 in assemblies 124 and 128.

Once a substrate has been placed in the cool plate assembly area, the substrate may be moved to one of hot plate assemblies 124 or 128 by one of two local linear transfer arms 208 or 210. Upper local linear transfer arm 208 is driven by a motor 220 and translates in a slot 222 in wall 240. Similarly, lower transfer arm 210 is driven by motor 230 and translates in a slot 232 in wall 240. For clarity, slots 222 and 232 are shown with hatched lines. Slots 222 and 232 are of sufficient length so that either of transfer arms 208 or 210 can move to the center of either of hot plate assemblies 124 and 128. When not in use, transfer arms 208 and 210 are kept in a home position between cool plate assembly 128 and one of adjacent hot plate assemblies 124 and 126.

Figure 8A:
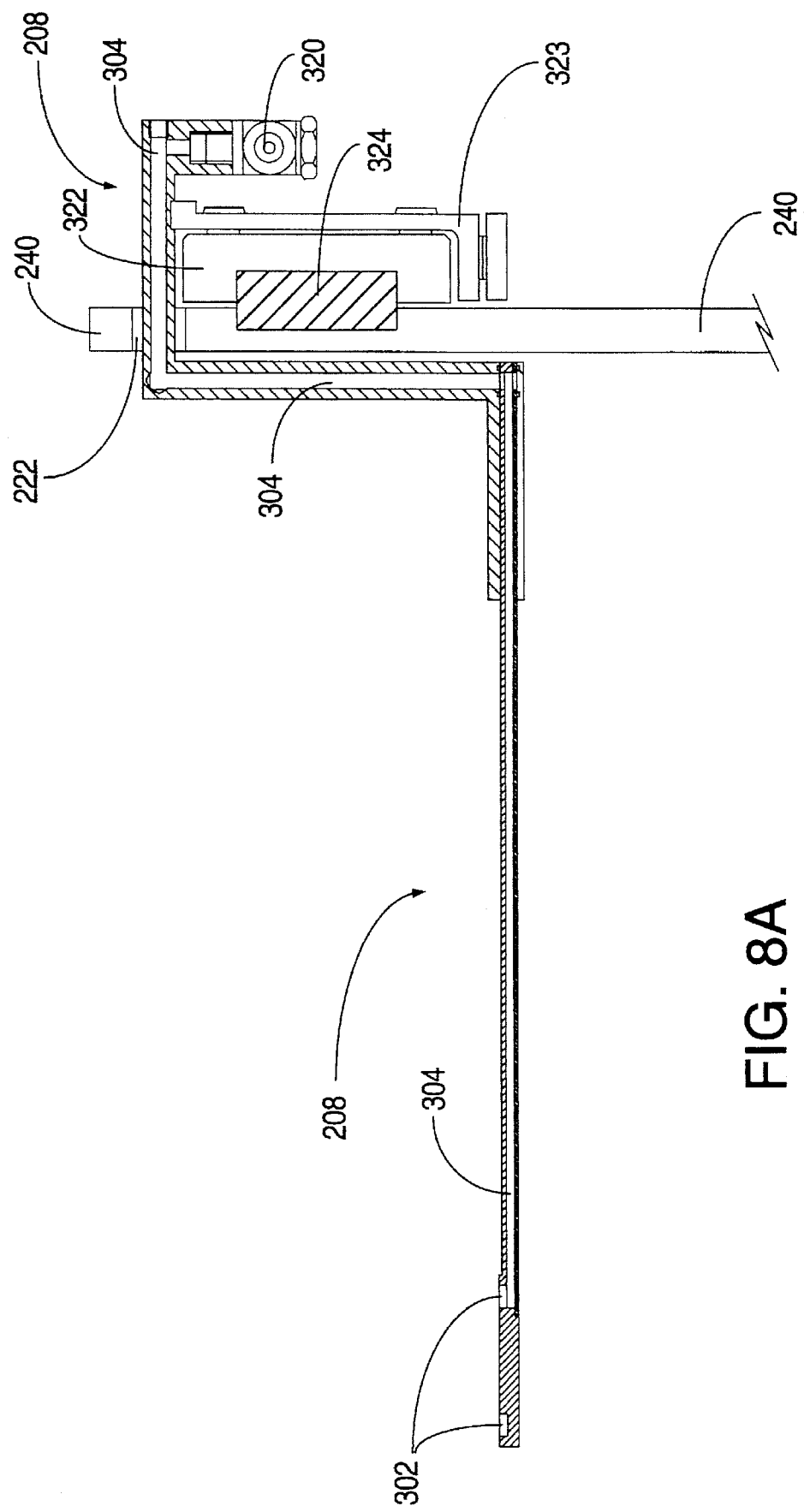
FIG. 8A illustrates a cross-sectional side view of a transfer arm carriage that supports a transfer arm behind a wall of the thermal process module.

FIG. 8A illustrates a cross-sectional side view of a transfer arm carriage 322 that supports a portion of transfer arm 208 that extends behind wall 240. As shown in FIG. 8A, transfer arm 208 is mounted on transfer arm carriage 322 by a bracket 323. Transfer arm carriage 322 is a simple carriage with bearings that slides along a rail 324 mounted in wall 240. Since carriage 322 is rigidly connected to transfer arm 208, transfer arm 208 moves with carriage 322 whenever carriage 322 is driven by motor 220 (FIG. 7).

Transfer arm 208 has a vacuum clamp 302 (FIG. 8A) which is supplied vacuum by line 304 inside arm 208. Line 304 is formed in transfer arm 208 in the conventional manner. Line 304 is connected via a T-connector 320 to a vacuum tube mechanism (FIG. 8B).

Figure 8B:
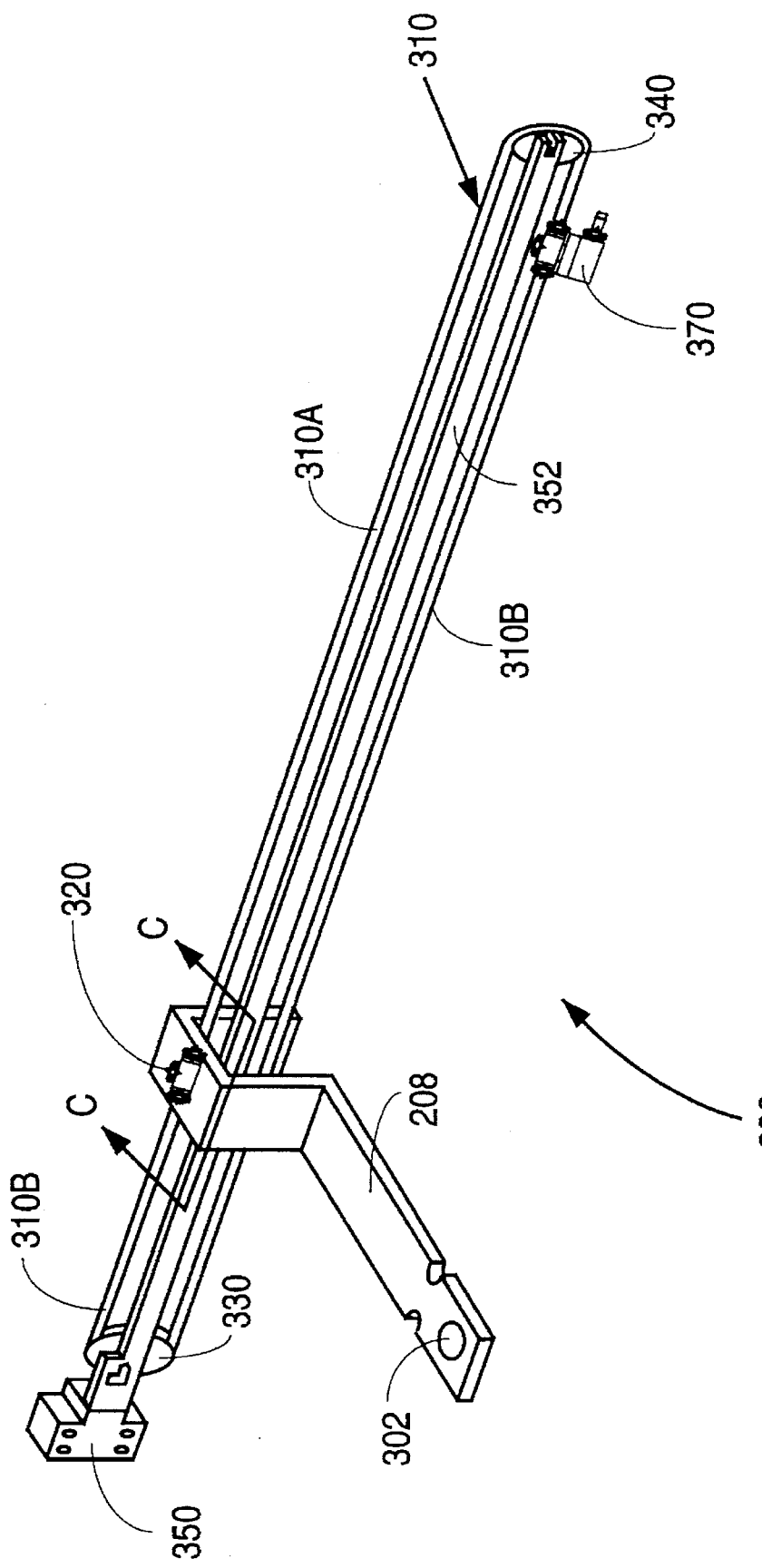
FIG. 8B illustrates a perspective view of a vacuum tube mechanism that supplies vacuum to a vacuum line of a transfer arm.
Figure 8C:
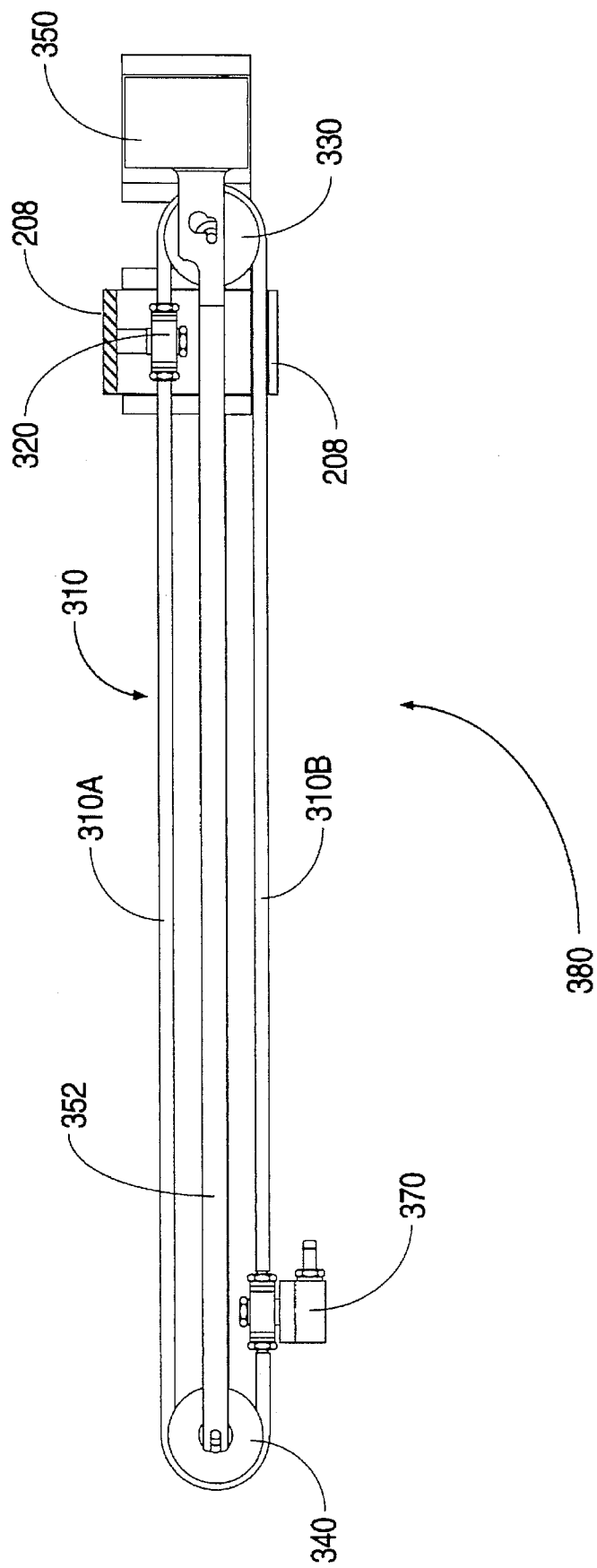
FIG. 8C illustrates a rear elevation view of a vacuum tube mechanism.

FIGS. 8B and 8C illustrate a perspective view and a rear elevation view, respectively, of a vacuum tube mechanism 380 that supplies vacuum to clamp 302 via line 304 of arm 208. As shown in FIG. 8B, tube mechanism 380 includes tube 310 which is wrapped around pulleys 330 and 340. Pulley 330 is supported by pulley carriage 350. Pulley carriage 350 has a long support arm 352 that supports pulley 340. Tube 310 has two T-connectors 320 and 370. T-connector 370 is rigidly fixed and connects tube 310 to a vacuum supply line in the housing wall (not shown). T-connector 320 connects tube 310 to transfer arm 208 (shown better in FIG. 8C). Since tube 310 is rigidly connected to transfer arm 208 (via T-connector 320), any movement of transfer arm 208 causes tube 310 to rotate pulleys 330 and 340. Since T-connector 370 is fixed, pulley carriage 350 translates in the same direction as transfer arm 208, albeit at one-half the velocity.

Figure 8D:
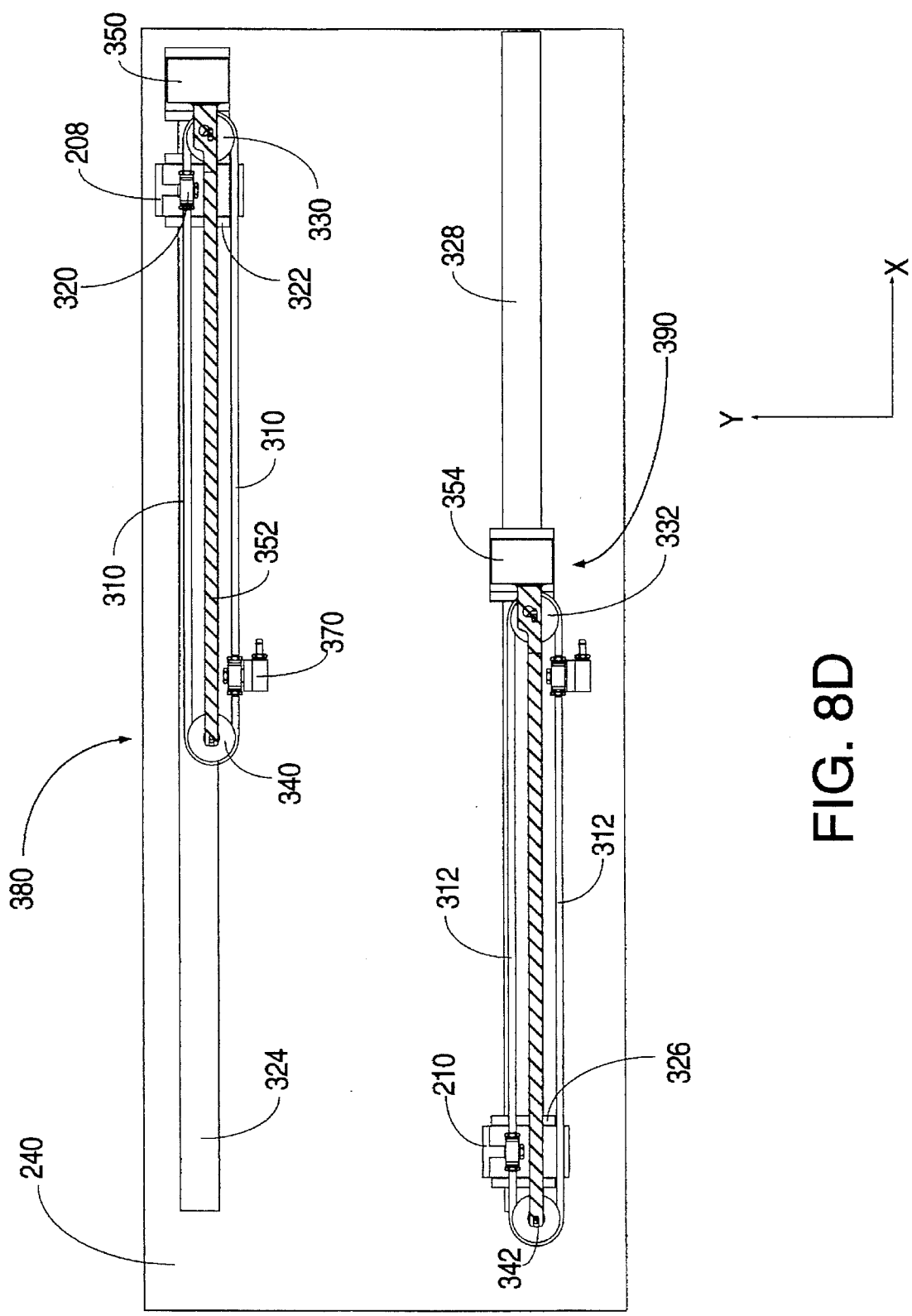
FIG. 8D illustrates a rear view of the thermal process module showing vacuum tube mechanisms mounted on a wall of the thermal process module.

FIG. 8D illustrates a rear view of the thermal process module showing tube mechanisms 380 and 390 mounted on housing wall 240. For clarity, wall 240 is shown without slots 222 and 232 and the Y-dimension distance is shown exaggerated. As shown in FIG. 8D, slide rail 324 on wall 240 supports pulley carriage 350 of tube mechanism 380. Since pulley carriage 350 supports both pulleys 330 and 340, the whole tube mechanism 380 can slide along rail 324. A T-connector 370 connects tube 310 to a stationary vacuum line (not shown) in wall 240.

Tube mechanism 380 moves in the X direction along rail 324 in the following manner. A lower portion of tube 310 stays stationary at T-connector 370, while another portion of tube 310 at T-connector 320 moves with arm 208. The rest of tube mechanism 380 including tube 310, pulleys 330 and 340 and carriage 350 translate in the X direction at different speeds. Transfer arm carriage 322 travels at twice the speed of pulley carriage 350 since both carriages 350 and 322 ride on the same slide rail. When transfer arm carriage 322 reaches the left end of slide rail 324, pulley carriage 350 reaches the middle of slide rail 324. (Such a position of tube mechanism 380 is illustrated in FIG. 8D by the position of tube mechanism 390). In the preferred embodiment, pulleys 330 and 340 move a total distance of 12 inches, while carriage 322 (and transfer arm 208) moves a total distance of 24 inches.

Tube mechanism 390, which guides transfer arm 210, operates in a similar manner, with tube 312 rotating pulleys 332 and 342 and transfer arm carriage 326 and pulley carriage 354 sliding on slide rail 328.

The above described tube mechanism permits vacuum to be supplied to arms 208 and 210 while keeping the vacuum tubing in a compact space with limited movement. Such a unique pulley arrangement eliminates loose tubing and the associated dangers of tubing getting caught in the path of a robot arm or a belt and getting chewed up and broken.

FIGS. 9A and 9B illustrate the rear elevation view and the front elevation view respectively of thermal process module 112 (without hot plate assemblies 124, 126 and cool plate assembly 128). Transfer arm carriage 322 of upper tube mechanism 380 is attached to and driven by a belt 412. As noted above, movement of carriage 322 causes pulley carriage 350 and associated pulleys 330 and 340 to move at half the speed of carriage 322. In this manner, belt 412 causes mechanism 380 to translate along the X-direction. Similarly, a belt 414 is attached to transfer arm carriage 326 and causes lower transfer arm mechanism 390 to translate along the X-direction.

Belts 412 and 414 are toothed belts that are driven independently of each other by motors 422 and 424. Thus transfer arms 208 and 210 likewise move independently of each other. Independent movement of transfer arms 208 and 210 ensures that substrates can be transferred from or to any hot plate assembly or cool plate assembly independently of what is happening in the rest of the thermal process module.

Motors 422 and 424 that drive transfer arms 208 and 210 are electrically controlled by a microprocessor based module controller 122 (FIG. 6). Encoders (not shown) monitor each of motors 422 and 424 to provide feedback to module controller 122. Therefore the precise position and the movement of transfer arms 208 and 210 is controlled by module controller 122. Module controller 122 senses the position of transfer arms 208 and 210 via three upper transfer arm position sensors 242 and three lower transfer arm position sensors 442 (FIG. 9B). Position sensors 242 and 442 are triggered by position signalling flags 408 and 410 that are carried by transfer arms 208 and 210 respectively. Position sensors 242 and 442 are conventional optical interrupters such as those available from Omron Corp. of One East Commerce Drive, Schaumburg, Ill. 60173.

Figure 10A:
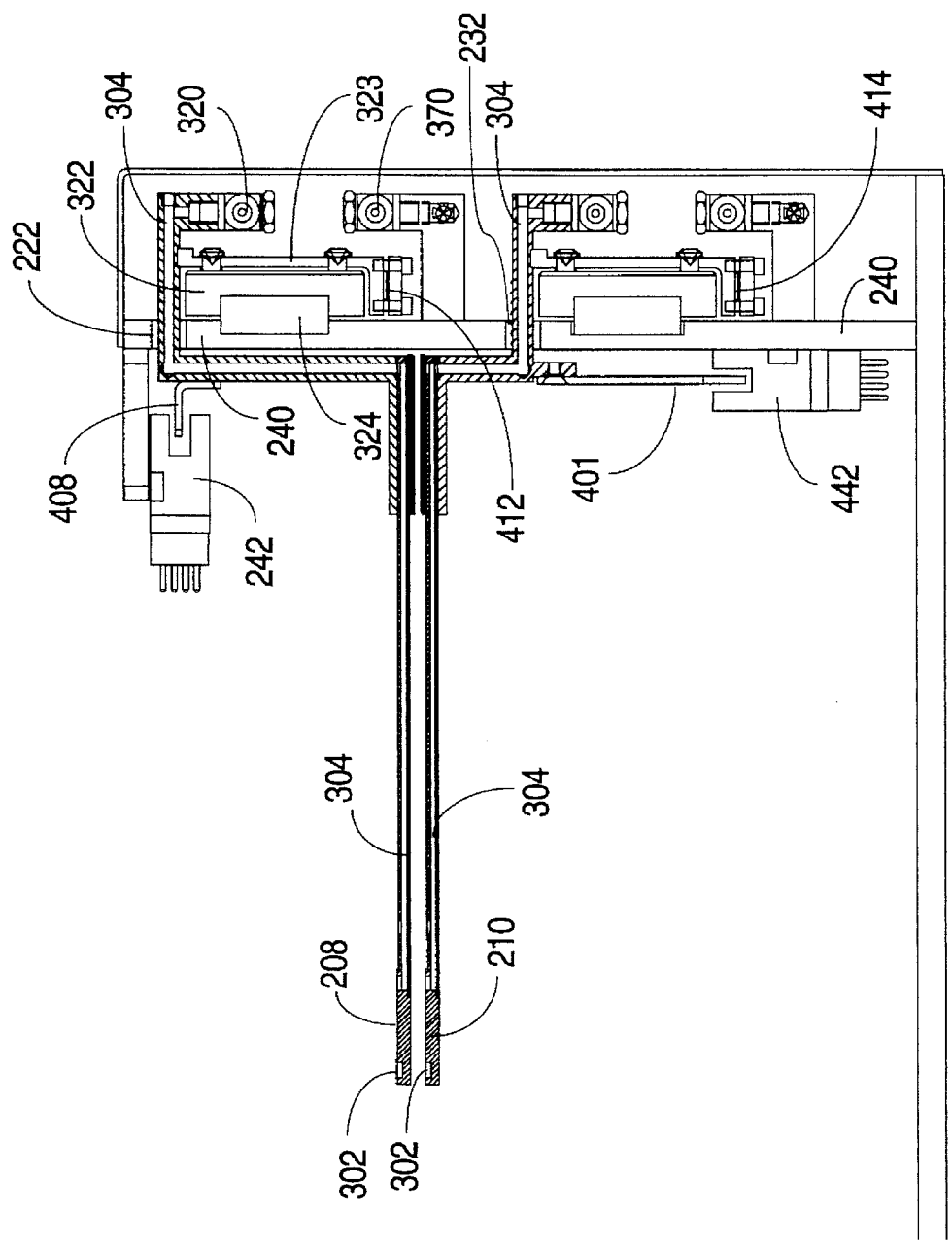
FIG. 10A illustrates a side view of the thermal process module.

FIG. 10A illustrates a side view of thermal process module 112. As shown in FIG. 10A, adequate vertical clearance is provided between transfer arms 208 and 210 so that transfer arms 208 and 210 can pass each other while carrying a substrate. In the preferred embodiment, there is a quarter inch distance between the elevations of the transfer arms 208 and 210.

Also, as shown in FIG. 10A, upper transfer arm position sensors 242 are mounted horizontally and are triggered by the passage of L-shaped flag 408 through them. Lower transfer arm position sensors 442 are mounted vertically and are triggered by passage of triangular shaped flag 410 (through them).

Figure 10B:
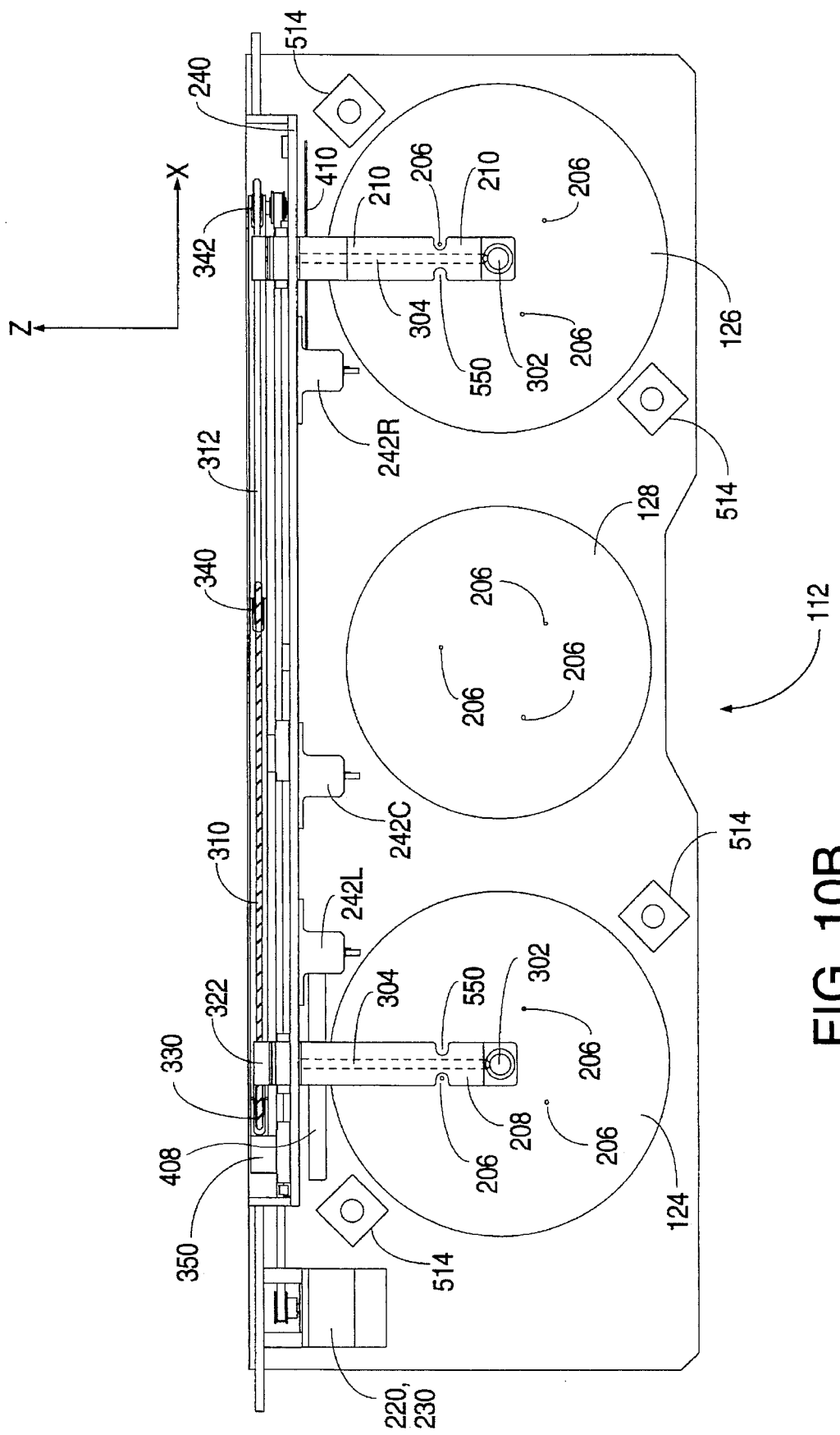
FIG. 10B illustrates a plan view of the thermal process module.

FIG. 10B illustrates a plan view of thermal process module 112. As shown in FIG. 10B, transfer arms 208 and 210 have sufficient length so that each arm reaches the center of hot plate assemblies 124 and 126 in the Z direction. Also, transfer arms 208 and 210 are provided with slots 550 so that each transfer arm can move in the X-direction to the center of either hot plate without being obstructed by lift pins 206. Each of transfer arms 208 or 210 may be kept by module controller 122 in a home position between cool plate assembly 128 and either of hot plate assemblies 124 and 126.

In FIG. 10B, upper position sensors 242 have been individually labeled as 242L, 242C, and 242R. Module controller 122 (FIG. 6) determines that a transfer arm is over a hot plate, a cool plate or in a rest position based on the outputs Limit 1, Home and Limit 2 respectively of position sensors 242L, 242C and 242R. For example, if a transfer arm 208 is over hot plate assembly 124, then sensor 242L is interrupted. Sensor 242L stays interrupted until flag 408 of arm 208 is completely clear of sensor 242L. Flag 408 is of adequate length so that flag 408 exits sensor 242L only after arm 208 is completely clear of hot plate 124 (see FIG. 9B). Right sensor 242R and lower transfer arm 210 are operated in a similar manner.

As shown in FIG. 10B, central sensor 242C is mounted off-center of cool plate assembly 128. This is done for the following reason. Initially, on powering up, module controller 122 does not know where transfer arms 208 and 210 are located. Movement of a transfer arm without knowledge of its initial location could result in collision of a transfer arm with lift pins 206 in one of the plate assemblies. Therefore, initially module controller 122 checks the output of central sensor 242C. If central sensor 242C is interrupted, microprocessor 122 concludes that transfer arm 208 is off-center to the left side (toward 242L) and therefore moves transfer arm 208 to the home position between hot plate assembly 124 and cool plate assembly 128. If central sensor 242C is not interrupted, microprocessor 122 concludes the reverse and moves transfer arm 208 to a home position between assemblies 126 and 128.

Figure 11:
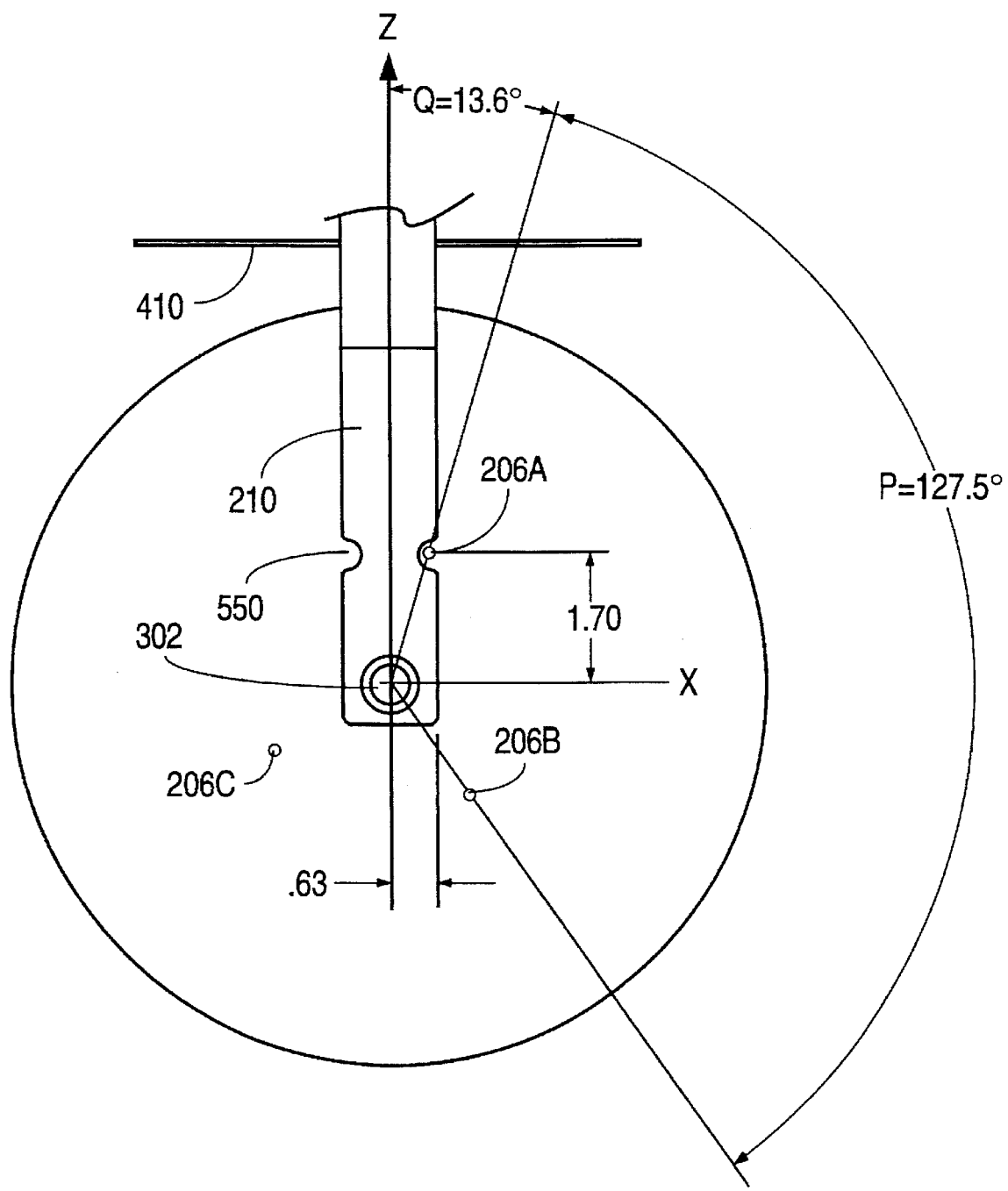
FIG. 11 illustrates the dimensions of the transfer arms and the angular positions of the lift pins of the right side hot plate assembly and the cool plate assembly.

FIG. 11 illustrates the dimensions of the transfer arms and the angular positions of lift pins 206 (which have been individually labeled as 206A, 206B and 206C) of hot plate assembly 126 and cool plate assembly 128. Lift pins 206 on hot plate assembly 124 are configured in a mirror image configuration of FIG. 11. As shown in FIG. 11, each transfer arm has sufficient length so that the center of clamp 302 is concentric with the center of assembly 124, 126, 128. Such a length of a transfer arm permits vacuum clamp 302 to hold the substrate at the center of the substrate.

In the preferred embodiment, slots 550 are positioned 1.70 inch inward on transfer arm 210 as measured from the center of vacuum clamp 302. Slots 550 are semi-circular slots which are larger in diameter than the diameter of lift pins 206. Each transfer arm has a width of 1.25 inch.

Innermost lift pin 206A is positioned adjacent to an outer slot 550 of transfer arm 210 when transfer arm 210 is positioned over the center of hot plate assembly 126. Lift pin 206A is offset by an angle Q of 13.6° from the Z axis. The other lift pins 206B and 206C are positioned about the center of hot plate assembly 126 at the same radial distance as lift pin 206A but at an angle P of 127.5° with respect to innermost lift pin 206A. Lift pins 206 for cool plate assembly 128 are positioned in a configuration similar to the configuration for hot plate assembly 126 shown in FIG. 11. Lift pins 206 for hot plate assembly 124 are positioned in a mirror image configuration of lift pins 206 on hot plate assembly 126 of FIG. 11. The configuration of lift pins 206 on hot plate assemblies 124 and 126 permits each transfer arm 208, 210 to move up to the center of either hot plate assembly 124 or 126 without being obstructed by lift pins 206, even if lift pins 206 are in their fully lifted position above hot plate assembly 124 or 126.

Lift pins 206A, 206B and 206C can move a substrate (not shown) from or to a hot plate or cool plate assembly 124, 126 or 128 so that the substrate may be transferred to or from a transfer arm 208 or 210. In the preferred embodiment, lift pins 206A, 206B and 206C may be lifted to one of two positions, the first position being quarter of an inch above the hot plate and the second position being half of an inch above the hot plate. Each of these positions corresponds to the elevation of one of the transfer arms 208 and 210. The distance between first and second positions is chosen to provide a clearance of 0.09 inch between the upper transfer arm 208 and a substrate on the lower transfer arm 210. Also, the distance of the first position is chosen to provide a clearance of 0.09 inch between the lower transfer arm 210 and a substrate on the cool plate. The first and second positions were chosen to correspond to the spacing inside a substrate cassette.

Figure 12:
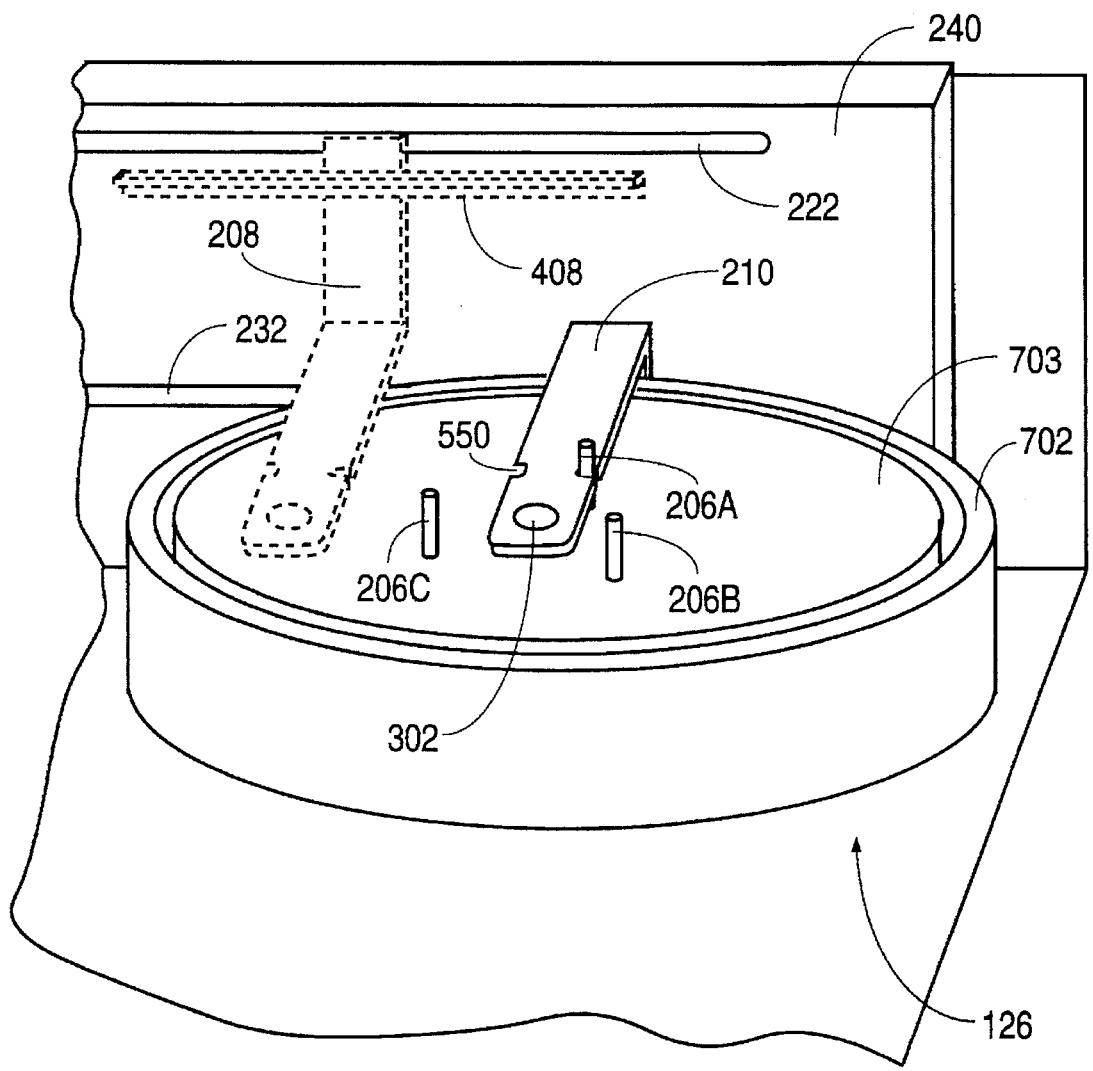
FIG. 12 illustrates a perspective view of a hot plate assembly of the thermal process module.

FIG. 12 illustrates a perspective view of a hot plate assembly of the thermal process module. Hot plate assembly 126 includes a housing 702 which surrounds a hot plate 703. Either of transfer arms 208 or 210 may be moved under a substrate once the substrate has been lifted by lift pins 206A, 206B and 206C. Module controller 122 (FIG. 6) ensures that only one of the two transfer arms is positioned over a hot plate assembly at any one time (for this reason arm 208 is shown by a broken line).

Figure 13:
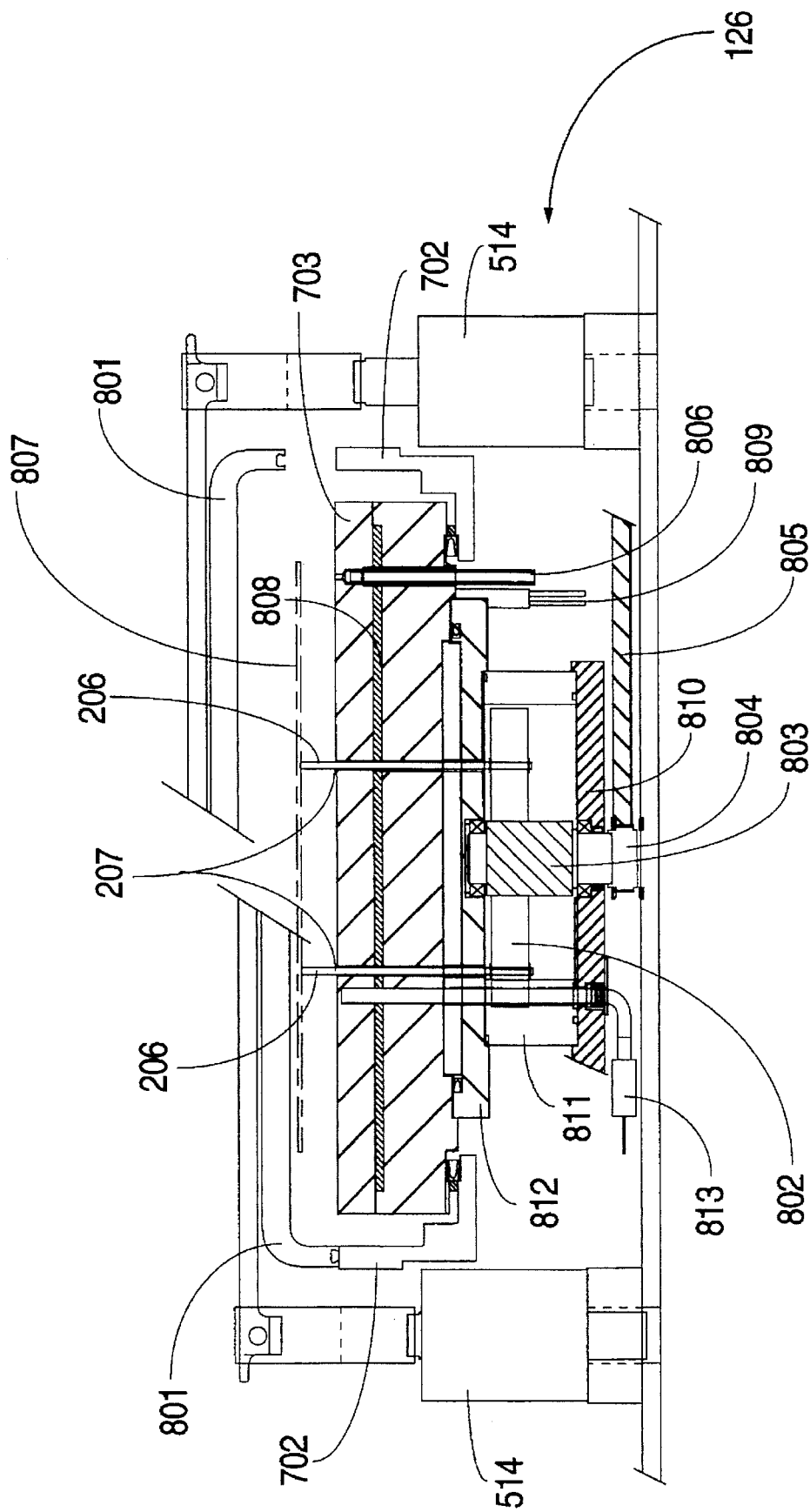
FIG. 13 illustrates a cross-sectional view of a hot plate assembly of the thermal process module taken from direction A—A shown in FIG. 6.

FIG. 13 illustrates a cross-sectional view of hot plate assembly 126 taken from the direction A—A shown in FIG. 6. For illustrative purposes, some components of the hot plate assembly are shown in FIG. 13 although they would not be normally seen in the cross-sectional view. Hot plate assembly 126 is provided with an oven cover 801 to keep heat loss to a minimum. Oven cover 801 rests on housing 702 and may be lifted by cover lift cylinder 514. Lift cylinders 514 are arranged as shown in FIG. 10B to permit movement of transfer arms 208 and 210 up to the center of hot plate assemblies 124 and 126. Referring back to FIG. 13, lift cylinder 514 on the left side of FIG. 13 is shown in a retracted position so that oven cover 801 rests on housing 702. On the right side of FIG. 13, lift cylinder 514 is shown in an extended position so that oven cover 801 is lifted to allow a wafer 807 to be transferred into or out of hot plate assembly 126. Microprocessor 122 controls the opening and closing of oven cover 801 and ensures that a transfer arm is not underneath the oven cover while the cover is being shut. Also, as shown in FIG. 13, lift pins 206 are rigidly connected to a lift plate 802. Lift plate 802 is supported and moved by a central lead screw 803. Lead screw 803 ensures that the substrate is lifted by pins 206 parallel to hot plate 703. Lead screw 803 preferably has a large diameter (e.g. 1.0 inch) to provide stability to lift plate 802 and lift pins 206.

Lead screw 803 is rotated via a lead screw pulley 804 by timing belt 805. Timing belt 805 may be driven by a motor (not shown) controlled by module controller 122 (FIG. 6). Hot plate 703 has vacuum lines 806 which supply vacuum to vacuum clamps (not shown) as well as to lift pin holes 207 so that a substrate 807 is held firmly in place while being heated. A thermocouple 813 is positioned so as to monitor the temperature of hot plate 703.

Hot plate assembly 124 is constructed as a mirror image of hot plate assembly 126.

Figure 14:
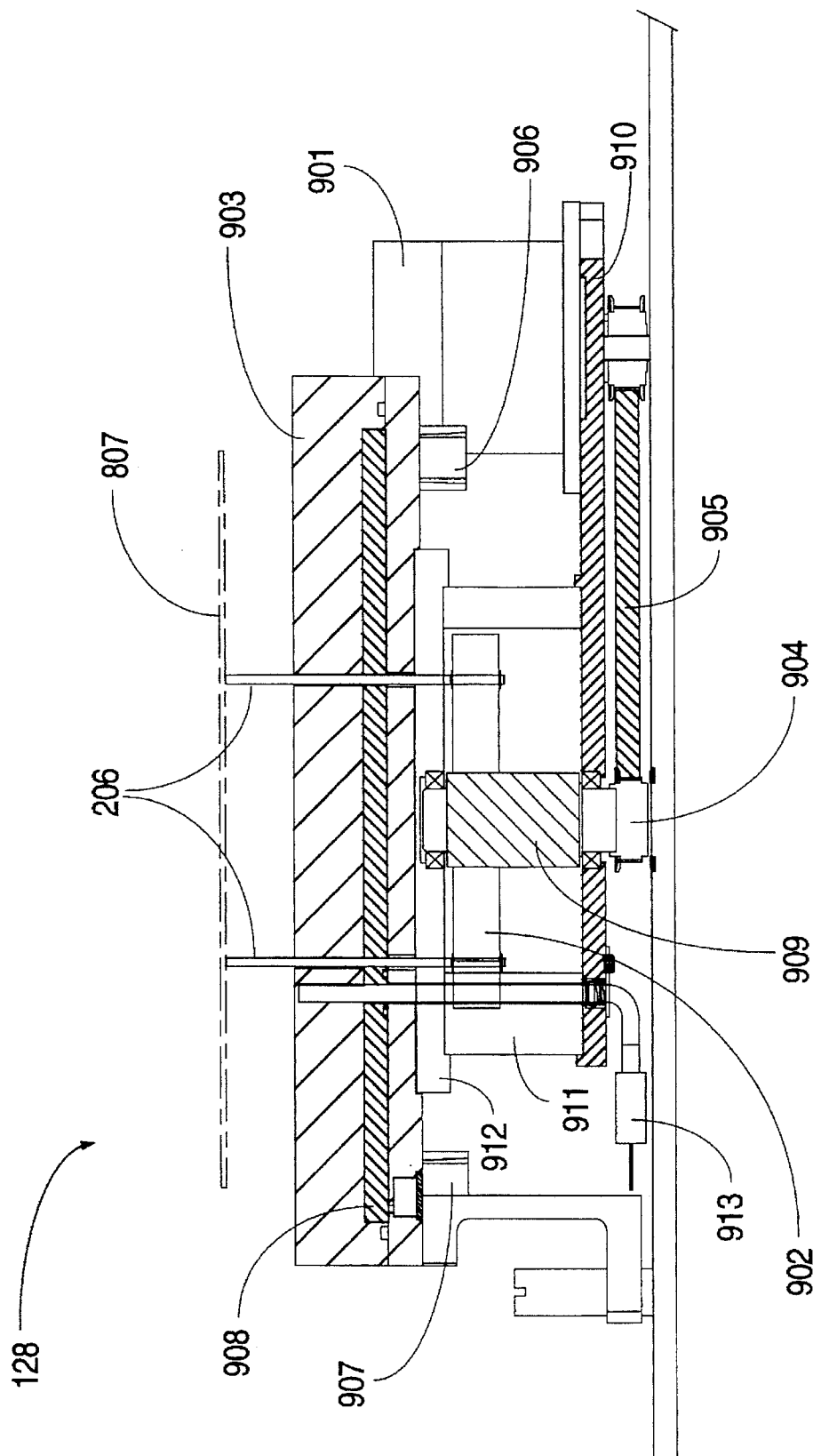
FIG. 14 illustrates a cross-sectional view of the cool plate assembly of the thermal process module taken from direction B—B shown in FIG. 6.

FIG. 14 illustrates a cross-sectional view of the cool plate assembly of the thermal process module. Cool plate assembly 128 includes lift motor and encoder 901, chill plate 903, lift pins 206, lift plate 902, lead screw 909, pulley 904, timing belt 905 cooling water inlet 906, cooling water outlet 907, water channels 908 and mounting members 910, 911 and 912. A thermocouple 913 is positioned so as to monitor the temperature of chill plate 903. All of these components are similar to the components of the hot plate assembly described above in reference to FIG. 13, with one exception. Cool plate lift pins 206 may be lifted to three positions. Two of the positions are identical to the elevated positions of the hot plate lift pins and correspond to the elevations of transfer arms 208 and 210. Thus a half inch position of the cool plate lift pins corresponds to the quarter inch position of the hot plate lift pins and lower transfer arm 210. Similarly, a three quarters inch position of the cool plate lift pins corresponds to the half inch position of the hot plate lift pins and upper transfer arm 208. The third position is at an elevation below the first and second positions of the hot plate lift pins. To accommodate this third position, cool plate assembly 128 is mounted at a lower elevation than hot plate assemblies 124 and 126. This configuration allows cool plate lift pins 206 to hold a substrate in the third position while permitting transfer arms 208 and 210 to travel over cool plate assembly 128 while transferring substrates from one hot plate assembly to the other hot plate assembly. This configuration also allows a substrate to be placed in or retrieved from the area substantially above cool plate assembly 128 of thermal process module 112 by external robot 132. Any one of the three lift pin positions may serve as a robot transfer position for transfer of the substrate to the external robot.

Figure 15:
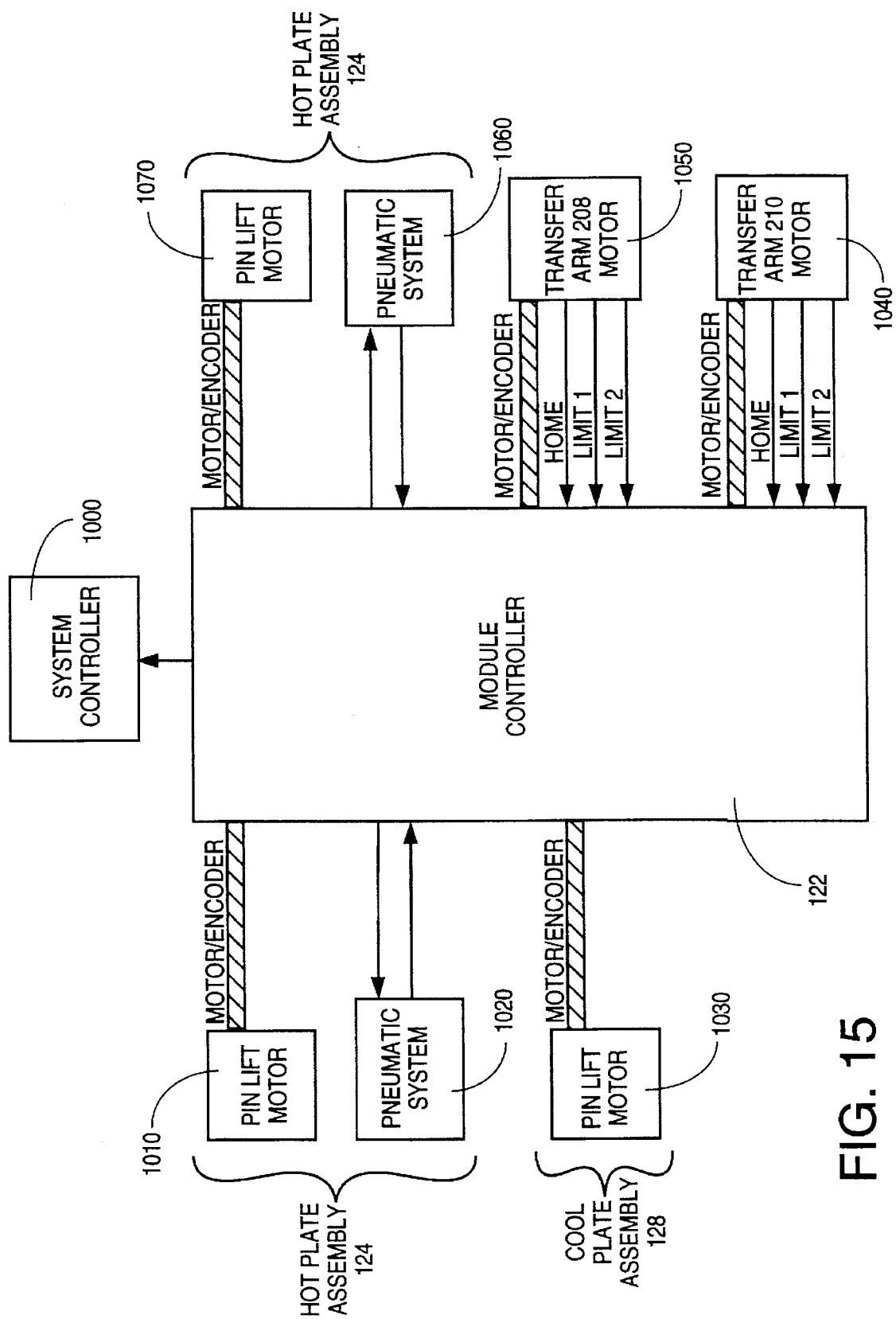
FIG. 15 is an illustrative block-diagram of a module controller used in the thermal process module.

FIG. 15 is an illustrative block-diagram of a module controller used in the thermal process module. As shown in FIG. 15, a module controller 122 is electrically connected to motors 1010, 1070 for moving lift pins 206; pneumatic systems 1020, 1060 for lifting the oven covers of hot plates 124 and 126; motor 1030 for moving the lift pins 206 of the cool plate and motors 1040, 1050 for moving transfer arms 208 and 210 and position sensors 242L, 242C and 242R (not shown) that communicate outputs Limit 1, Home and Limit 2 (as discussed above in reference to FIG. 10B). Pneumatic systems 1020, 1060 include lift cylinders 514 (see FIG. 13) and solenoid valves (not shown). Module controller 122 is also connected to the various sensors such as photo interrupters, thermocouples etc. (not shown in FIG. 15). Therefore module controller 122 can control each and every moving part in the thermal process module 112.

The manner of operation of photolithography system 110 will now be described. System 110 is controlled by a system controller 1000. System controller 1000 issues high level commands to and receives high level status information from module controller 122 for each of the thermal process modules 112. Each module controller 122 is connected to the system controller in a master-slave relationship.

Each module controller 122 assists the system controller in coordinating the functions of the thermal process module in which it resides. Module controller 122 performs such functions as scheduling bike times, actuating air cylinders and vacuum lines, controlling motors, monitoring sensors, dispensing chemicals, etc. Module controller 122 also synchronizes the operation of the transfer arms to ensure that there is no conflict between them. Module controller 122 plans ahead of time, prior to initiation of a bake cycle to ensure that the cool plate assembly will be available as soon as a substrate has finished its precise baking time in a hot plate assembly.

In the preferred embodiment, an Intel 80186 microprocessor is used for module controller 122. Two preferred methods for using the thermal process module are described in Appendix A as "Normal Operation Sequence: Parallel Operation" and "Normal Operation Sequence: Serial Operation." In parallel operation of thermal process module 112, each hot plate assembly is used alternately: a first substrate is baked in a hot plate assembly for its baking time and a second substrate is baked substantially simultaneously in a different hot plate assembly for its baking time. Therefore parallel operation of the thermal process module increases the total throughput of the system. In serial operation, each substrate goes through the same equipment sequentially: each substrate is baked first in one hot plate assembly and later transferred to and baked in the other hot plate assembly. Therefore in serial operation of the thermal process module, each substrate has the same baking history.

In the description in Appendix A "Substrate 1" refers to a first semiconductor wafer that is brought into the thermal process module 112 earlier than "Substrate 2" which refers to a second semiconductor wafer that is brought in later. Although transfer arms 208 and 210 and hot plate assemblies 124 and 126 are specifically referred to in Appendix A, these components may be exchanged for each other in accordance with this invention.

To illustrate the operation of the system, the transfer of a substrate to the cool plate assembly, to a hot plate assembly, and then back to the cool plate assembly will be described. When a substrate is to be heated, it is transferred from cassette I/O unit 140 by robot 132 to transfer arm 208 in an area adjacent chill plate 903. Then vacuum is applied to vacuum clamp 302 (FIG. 8) of arm 208 so that substrate 807 is securely held by transfer arm 208.

Module controller 122 then causes one of the hot plate assemblies 124 or 126 (in this example, assembly 126) to lift its cover 801. Then module controller 122 causes motor 220 to move transfer arm 208 (along with substrate 807) to a position above hot plate 703. Vacuum is released from clamp 302. Lift pins 206 are then raised to lift substrate 807 off transfer arm 208. Transfer arm 208 is moved back to its home position. Lift pins 206 are then lowered and vacuum is applied via line 806 to hold substrate 807 in place on hot plate 703. Cover 801 is lowered and substrate 807 is baked for the requisite time.

As soon as substrate 807 has completed baking, module controller 122 transfers substrate 807 from hot plate assembly 126 to cool plate assembly 128 in the following manner. Module controller 122 causes cover 801 to be lifted from housing 702. Vacuum is released from line 806 and substrate 807 is lifted by lift pins 206 to the one-half inch position, appropriate for transfer arm 208. Transfer arm 208 or 210 (in this example, transfer arm 208) is moved to the center of hot plate 703 under substrate 807. Then vacuum is applied to clamp 302 of transfer arm 208. Lift pins 206 are then retracted into a down position within lift pin holes 207 in assembly 126. Once substrate 807 is securely held by transfer arm 208 via clamp 302, transfer arm 208 along with substrate 807 is moved to the center of cool plate assembly 128 and vacuum is released. Module controller 122 ensures that the chill plate is always available when a substrate is finished baking by appropriate scheduling of the bake and cool times. Lift pins 206 are raised to lift substrate 807 off transfer arm 208. Transfer arm 208 is returned to its rest position and lift pins 206 are lowered so that substrate 807 rests on chill plate 903. Then vacuum is applied and substrate 807 is cooled for the requisite time.

When the cooling process is completed, module controller 122 informs the system controller. The system controller causes robot 132 to transfer the substrate to wherever the substrate needs to be sent next. For example, the substrate may be transferred to C/D section 142 where a spin coating machine may apply a layer of photoresist. Later on, the substrate may be transferred back to thermal process module 112 for the "soft" baking.

If for some reason a first substrate is finished cooling and is still present on the chill plate immediately prior to completion of baking of a second substrate, then module controller 122 causes the first substrate to be held on upper transfer arm 208 in a buffer position, so that the chill plate is vacated and available for cooling the second substrate. Thus when the second substrate is finished baking, the lower transfer arm 210 will move the second substrate from the hot plate assembly to the cool plate assembly. In this manner, none of the substrates are overbaked due to lack of availability of the chill plate. Also, since a cooled substrate may be held in the buffer position on a transfer arm, the throughput is not slowed down due to scheduling conflicts.

Although transfer arms move the substrates between the hot plate and cool plate assemblies, each transfer arm cools down when it is not actively moving a hot substrate. If both transfer arms are available, the cooler arm can be used to pick up a recently coated substrate from the cool plate and transfer it to the hot plate. Therefore, alternate use of the transfer arms permits a recently heated transfer arm to be given adequate time to cool off.

All these operations take place under the control of module controller 122 and the system controller. The system controller and module controller 122 co-operate to ensure that no more than two substrates are transferred into a thermal process module at any one time. While an operational example has been described above, those ordinary skilled in the art will be able to build a general module controller and system controller from the specific directions in Appendix A.

The thermal process module permits delivery of ambient temperature silicon substrates that are baked and cooled inside the module at precise temperatures for precise intervals of time. Substrates baked by the serial operation have consistently similar history of baking times and temperatures because each substrate undergoes the same process. In both serial and parallel operations, since there are as many transfer arms as there are hot plates, a transfer arm is always available whenever a substrate is finished baking. Thus there is no danger of overbaking. This increases yield.

Also, since the robot arm transfers substrates only from and to a cool plate assembly area and only handles cool substrates, the end effector never heats up. Since there is never any localized non-uniform heating of substrates, the substrates processed in accordance with this invention consistently have uniformly thick coatings.

Finally, the thermal process module of this invention is a very precise, compact and cost-efficient system for heating and cooling substrates. The thermal process module is compact since transfer arms 208 and 210 are relatively simple having a single-degree-of-freedom instead of the complex six-degree-of-freedom robots that have been used in some prior art systems. The amount of "dead space" surrounding arms 208 and 210 is kept to a minimum, and the space occupied by the hot plate and cool plate assemblies is likewise minimized by placing them adjacent each other. In fact, one embodiment of thermal process module 112 has a footprint of only 4.4 square feet so that the whole system 110 has a total footprint of only 15.2 square feet. Due to their small height, two or more thermal process modules can be stacked on top of each other and yet work with a single robot arm 132 (FIG. 6). In a preferred embodiment, the total height of three thermal process modules is 17 inches which is easily serviceable by a robot arm.

Also, the unique compact pulley arrangement of the tube mechanism permits vacuum to be supplied to the transfer arms without any loose tubing.

The description of an embodiment of this invention is intended to be illustrative and not limiting. Numerous other embodiments will be apparent to those skilled in the art, all of which are included within the broad scope of this invention.

The specific elements in this invention are not limited to those discussed in reference to the preferred embodiment. For example, the thermal process module may be designed with a single cool plate, a single hot plate and a single transfer arm.

Also, the invention is not restricted to the described positions of the hot and cool plates. For example, the cool plate may be located in substantially the same plane as the plane of the hot plates. Or multiple cool plates and hot plates may be stacked on top of each other.

Also, the invention is not restricted to using two transfer arms or to transfer arms that move in parallel planes. For example, the transfer arms could move within the same plane, along non-conflicting contours or even in conflicting contours if the module controller schedules out the conflicts. Or a transfer arm could translate along a line at an angle oblique to the horizontal so that a cool plate could be located in a plane substantially distant from a hot plate plane and yet be serviced. Or a transfer arm could be mounted to pivot about a given point.

Finally, it would be apparent to a person of skill in the art to either integrate the functions in the module controllers of each thermal process module into the system controller, or alternatively to go to a more distributed processing environment than described above.

Figure 16:
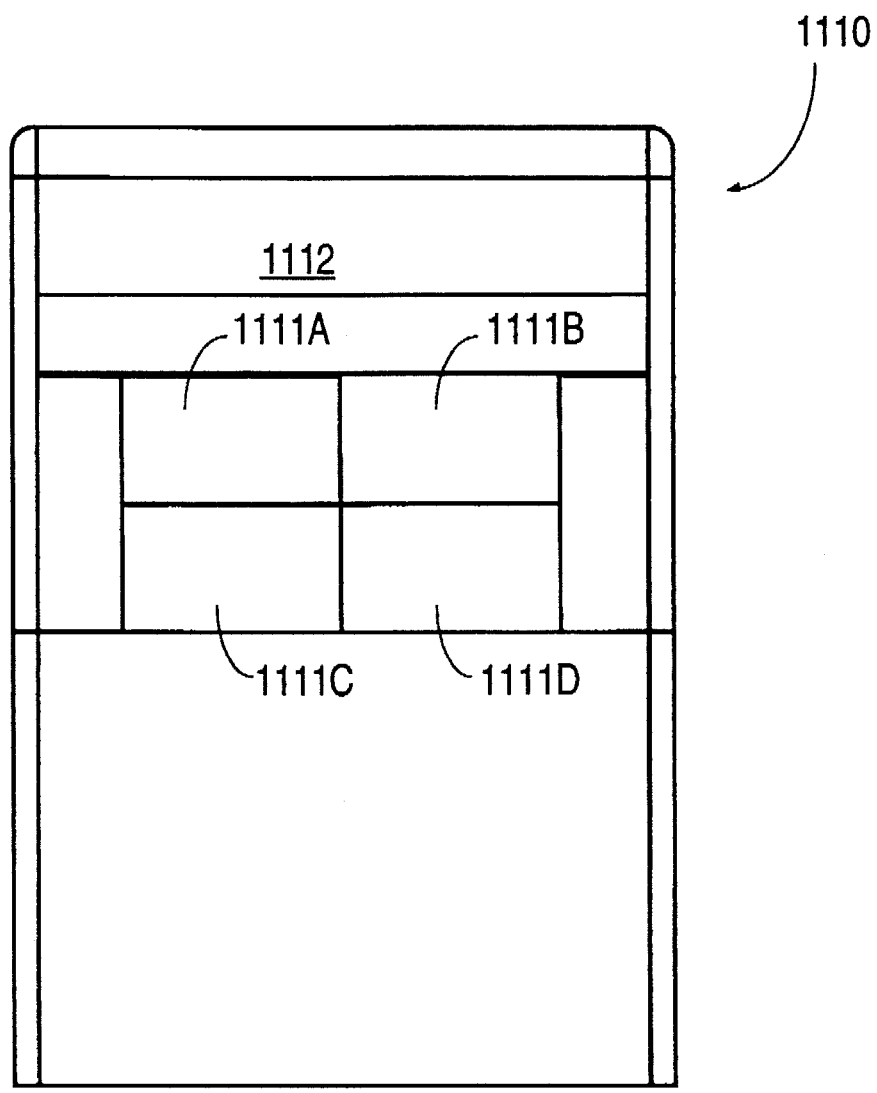
FIG. 16 illustrates an elevational view of a group of cassette input/output units according to this invention mounted in a photolithography system.

The apparatus and method according to this invention are not confined to semiconductor substrate photolithography systems, and can be used in any application that requires heating and cooling of objects. FIG. 16 illustrates a front elevation view of a photolithographic unit 1110, which contains cassette input/output units 1111A, 1111B, 1111C and 1111D according to this invention. As indicated, cassette input/output units are arranged in two columns. Photolithographic unit 1110 could contain a spin coating machine, a developing machine, a heating/cooling unit, or other components used in semiconductor wafer processing facilities. Unit 1110 in a preferred embodiment is controlled by a microprocessor in the manner described below.

Figure 17A:
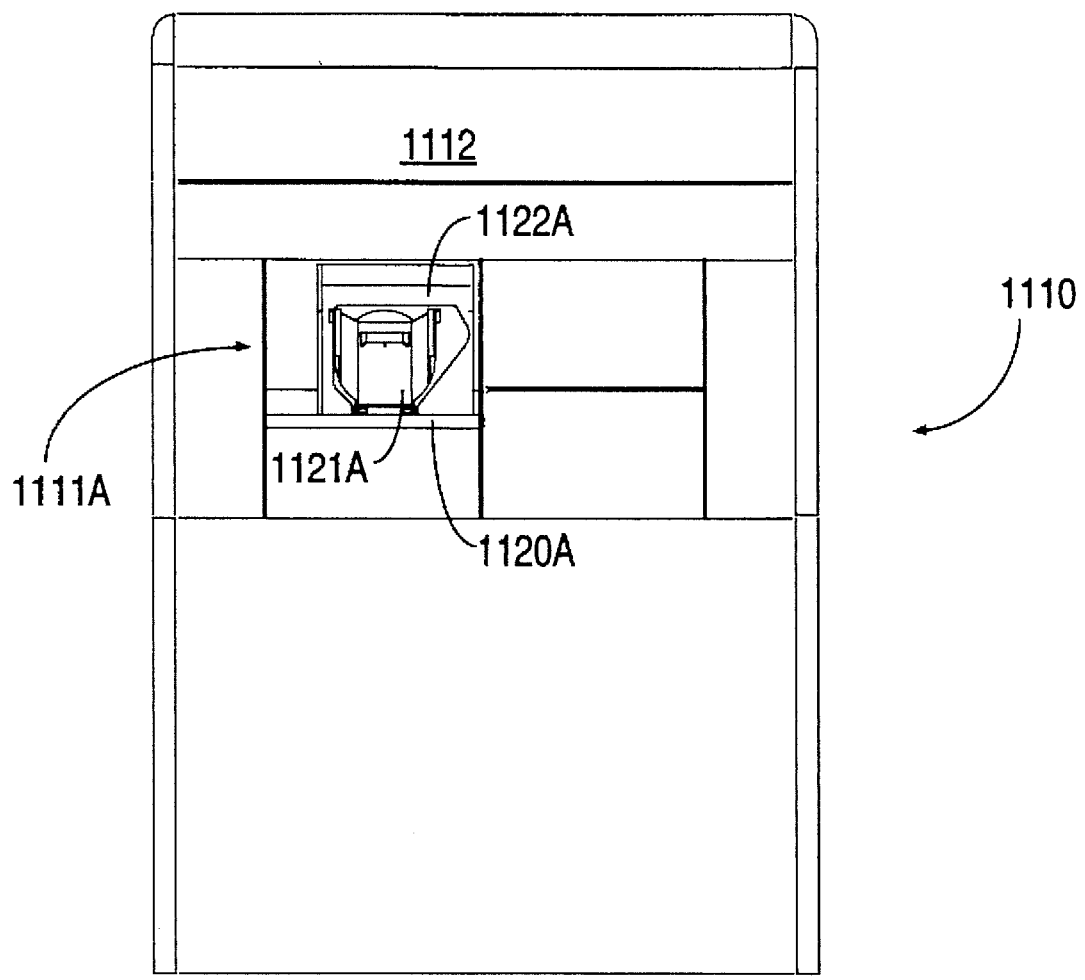
FIG. 17A illustrates a front elevational view similar to FIG. 16 with one of the cassette input/output units in an open position.
Figure 17B:
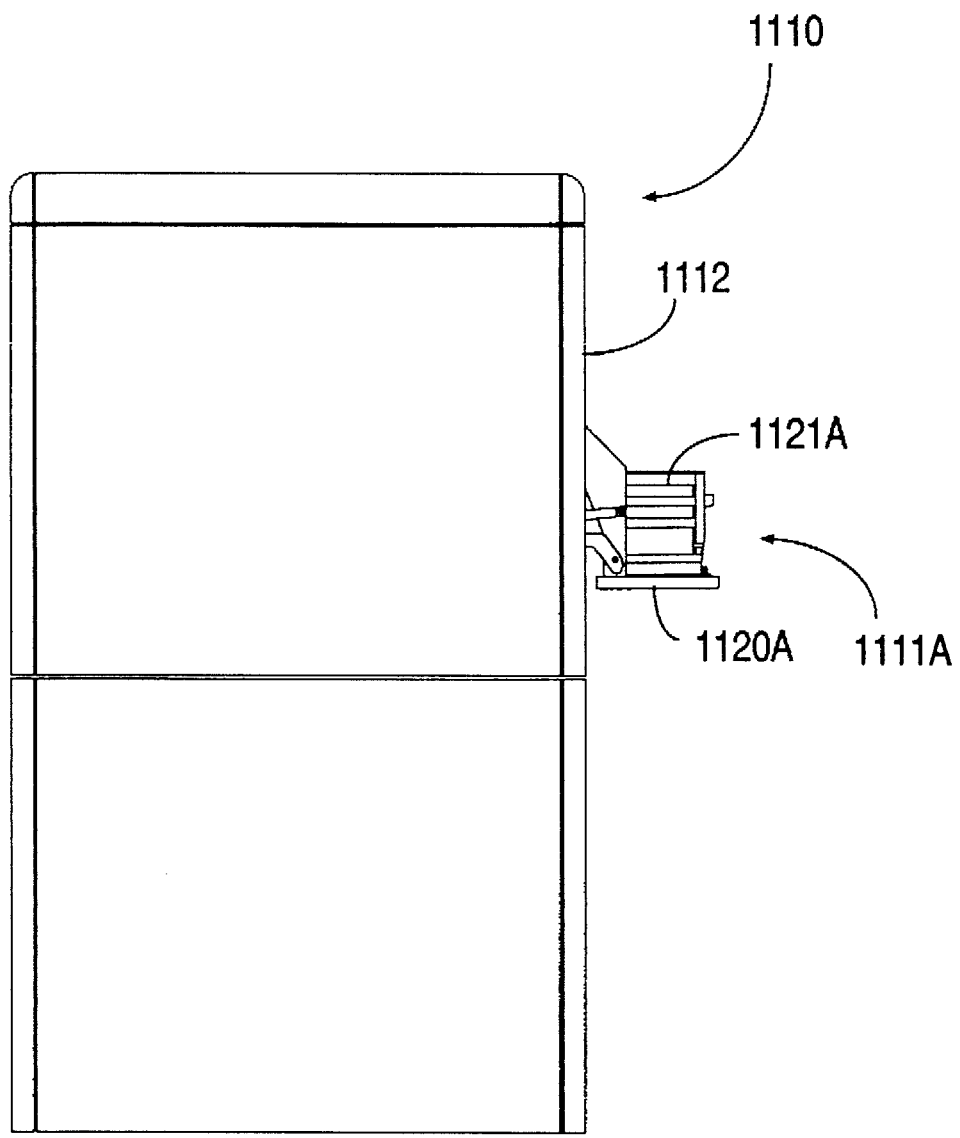
FIG. 17B illustrates a side elevational view of the photolithography system with one of the cassette input/output units in an open position.

FIG. 17A illustrates a similar view of unit 1110 with cassette input/output unit 1111A opened. FIG. 17B is a side elevation view of the same structure. Visible in either or both of FIGS. 17A and 17B are a drawer front 1120A, a wafer cassette 1121A and a drawer bottom 1122A.

Figure 18:
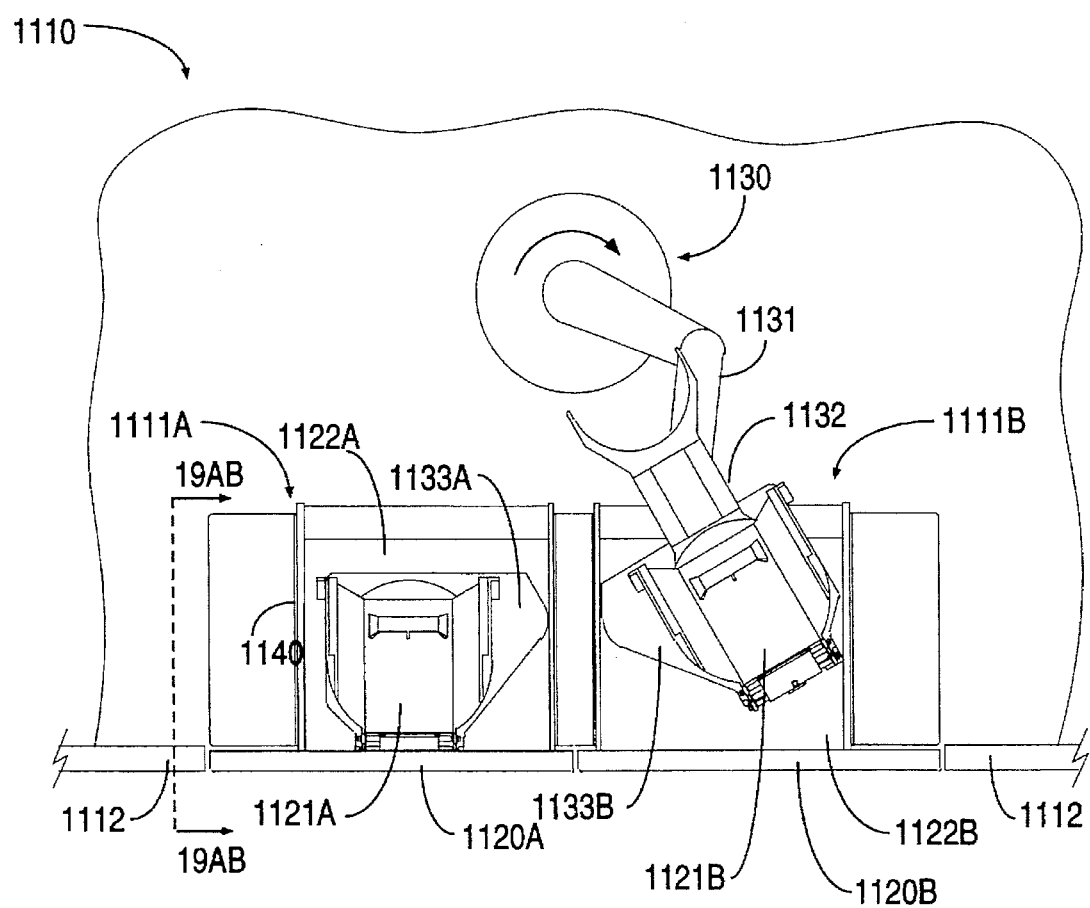
FIG. 18 illustrates a top plan view of two of the cassette input/output units in closed position.

FIG. 18 illustrates a top view of cassette input/output units 1111A and 1111B in the closed position. As is apparent, units 1111A and 1111B are essentially mirror images of each other. In FIG. 18, the wafer cassettes 1121A and 1121B are oriented vertically. Cassette input/output unit 1111B includes a drawer front 1120B, a drawer bottom 1122B, and a cassette 1121B. Also shown in FIG. 18 is a robot 1130 which is positioned pivotally inside photolithography unit 1110. Robot 1130 includes a robot arm 1131 and a double end effector 1132, which is capable of simultaneously holding two semiconductor wafers. Robot 1130 may be a three-degree-of-freedom robot manufactured by Equipe Technologies of Mountain View, Calif.

As indicated, robot 1130 is pivotable about a single vertical axis in unit 1110. Thus, for robot arm 1131 to gain access to wafers in both of cassettes 1121A and 1121B, it is necessary to pivot the cassettes about a vertical axis, as indicated by the position of cassette 1121B in FIG. 18. To accomplish this, rotation plates 1133A and 1133B are provided. Rotation plates 1133A and 1133B are positioned adjacent drawer bottoms 1122A and 1122B, respectively, and pivot about vertical axes by means of a mechanism which is described below.

Figure 19A:
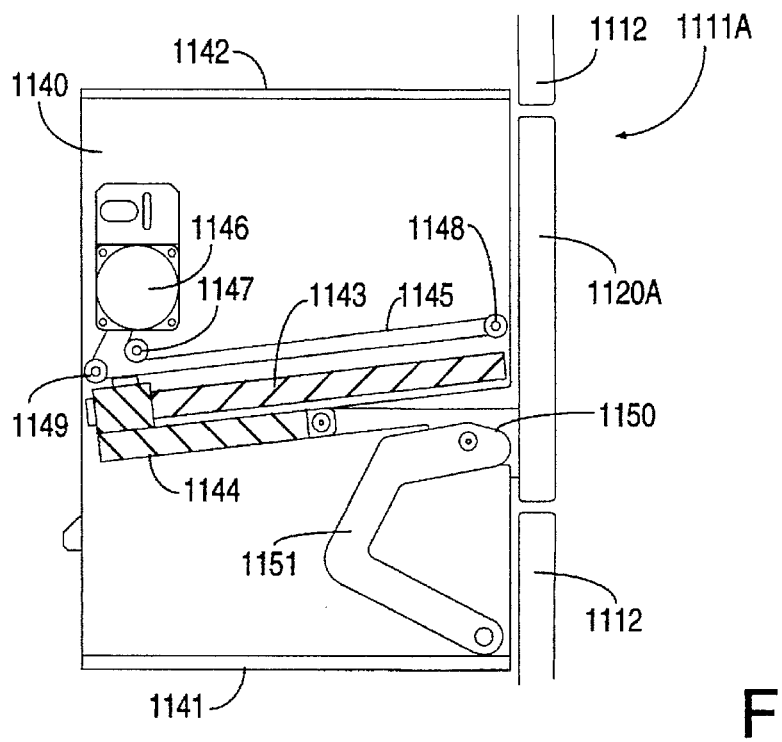
FIGS. 19A and 19B illustrate the mechanism for opening the cassette input/output unit, with the unit shown in closed and open positions, respectively.
Figure 19B:
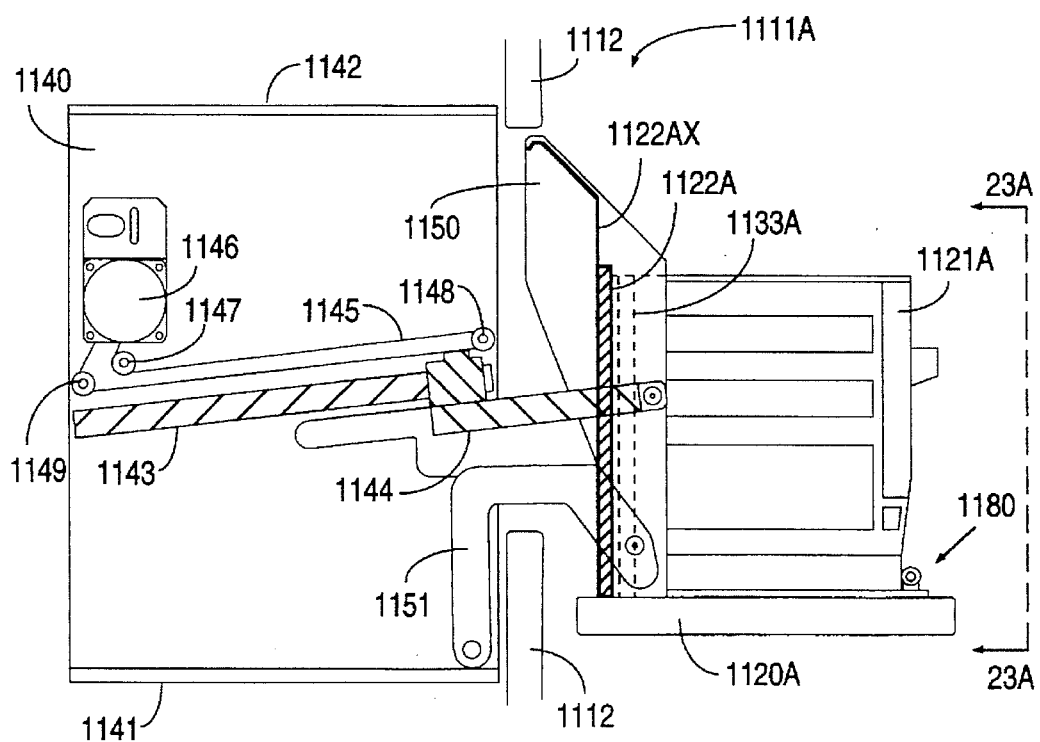

FIGS. 19A and 19B are side elevation views of cassette input/output unit 1111A shown in the closed and open positions, respectively. The basic structure of unit 1111A includes a left side plate 1140, a base plate 1141, and a top plate 1142. These structures are fixed and do not move. Unit 1111A is viewed from the left side (the direction indicated by arrows 19AB in FIG. 18), so that side plate 1140 is visible. It will be understood that a similar right side plate forms the opposite wall of unit 1111A. The operating structure connected to left side plate 1140 is mirrored on the right side of unit 1111A.

A slide rail 1143 is attached to the surface of side plate 1140. A slider 1144 slides along slide rail 1143. Attached to slider 1144 is a drive belt 1145, which is driven by a motor/encoder 1146. Drive belt 1145 is wrapped around pulleys 1147, 1148 and 1149, and drives slider 1144 along slide rail 1143. An end of slider 1144 is pivotally attached to a cassette I/O side 1150, which is joined to drawer front 1120A and drawer bottom 1122A. As shown in FIG. 19B, drawer bottom 1122A includes an extension 1122AX which serves to prevent the operator from reaching into the interior of photolithography unit 1111A.

Cassette I/O side 1150 is also pivotally attached to a crank 1151, the other end of which is pivotally attached to side plate 1140. Thus, as is evident from FIGS. 19A and 19B, as motor/encoder 1146 drives slider 1144 from its rearward position (FIG. 19A) to its forward position (FIG. 19B), drawer front 1120A rotates approximately 90° about a horizontal axis until it reaches the position shown in FIG. 19B. It is also apparent from FIGS. 19A and 19B that the unit which includes drawer front 1120A, drawer bottom 1122A and cassette I/O side 1150 undergoes translational movement to the right when it is opened, although this is not critical to the invention.

Conversely, motor/encoder 1146 closes unit 1111A by driving slider 1144 from its forward position to its rearward position on rail 1143. Thus, as indicated in FIG. 19B, wafer cassette 1121A is placed on drawer front 1120A with the wafers oriented vertically inside wafer cassette 1121A. Then, as unit 1111A is closed, cassette 1121A is rotated counterclockwise 90° until the wafers are oriented horizontally. Also, as indicated in FIG. 19B, when unit 1111A is in its open position, drawer bottom 1122A and extension 1122AX prevent an operator (who would be stationed to the right) from gaining access through unit 1111A to the interior of the equipment.

Figure 20A:
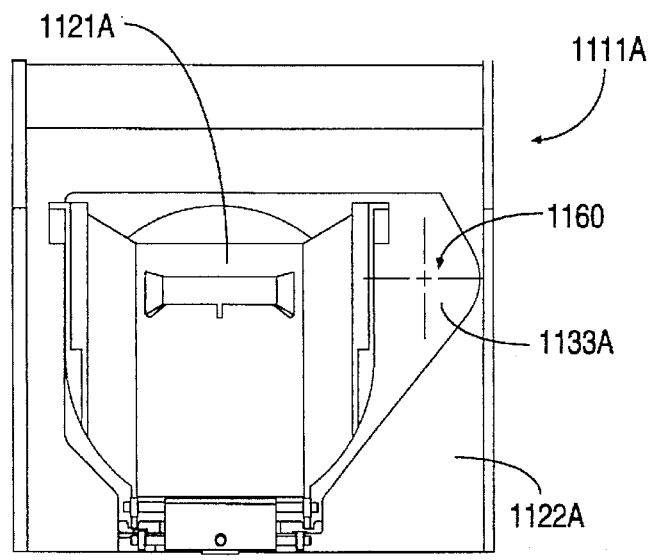
FIGS. 20A and 20B illustrate a top plan view of one of the cassette input/output units, with the rotation plate shown in retracted and rotated positions, respectively.
Figure 20B:
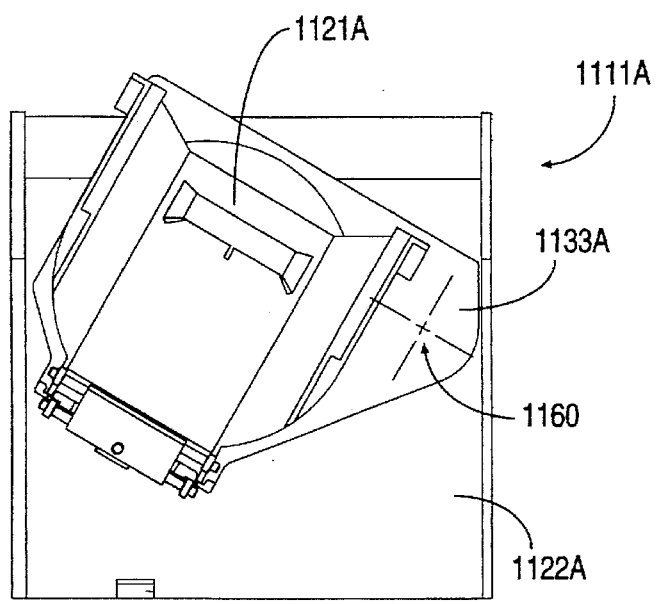

FIGS. 20A and 20B are detailed top views of rotation plate 1133A. As shown, rotation plate 1133A rotates clockwise about a pivot point 1160 to bring wafer cassette 1121A into a position (FIG. 20B) in which robot 1130 may gain access to wafers held in cassette 1121A. Of course, this feature of the invention may not be necessary if the robot inside photolithography unit 1110 does not require the cassette to be rotated in order to gain access to the wafers.

Figure 21A:
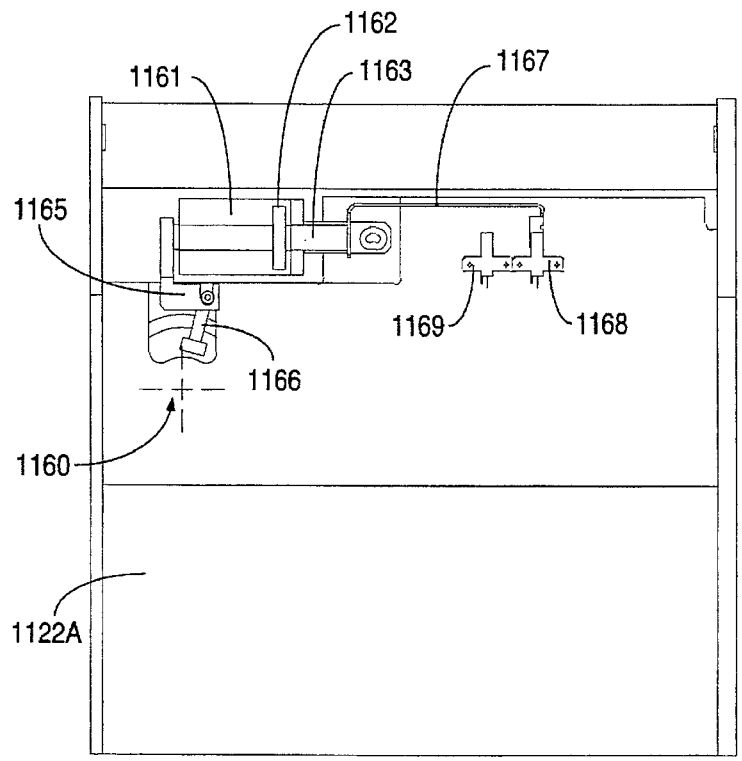
FIGS. 21A and 21B are bottom plan views of the cassette input/output unit with the rotation tray in retracted and rotated positions, respectively.
Figure 21B:
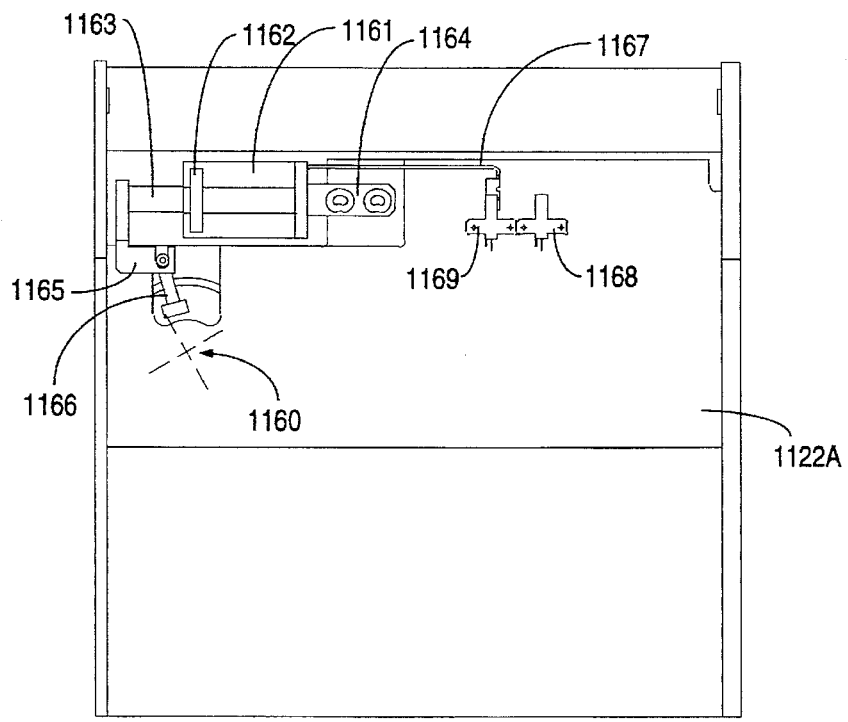

FIGS. 21A and 21B are views of the underside of drawer bottom 1122A, showing the mechanism that is used to rotatee rotation plate 1133A. This mechanism includes an air cylinder 1161, which is mounted to the bottom of drawer bottom 1122A by means of a bracket 1164. Extending through and from both ends of air cylinder.1161 is a piston rod 1163, which is attached to a piston 1162 (dashed lines) inside air cylinder 1161. Extending from rod 1163 is an actuator 1165 which engages a crank 1166 attached to the bottom of rotation plate 1133A.

The position of piston 1162 is controlled by adding pressurized air to either side of air cylinder 1161 through supply lines which are not shown. A position flag 1167 extends from rod 1163, the end of which actuates limit switches 1168 and 1169 to verify the position of rotation plate 1133A for the microprocessor. Limit switch 1168 operates when the rotation plate reaches the retracted position shown in FIG. 20A, and limit switch 1169 is actuated when rotation plate 1133A reaches the rotated position in FIG. 20B.

Figure 22A:
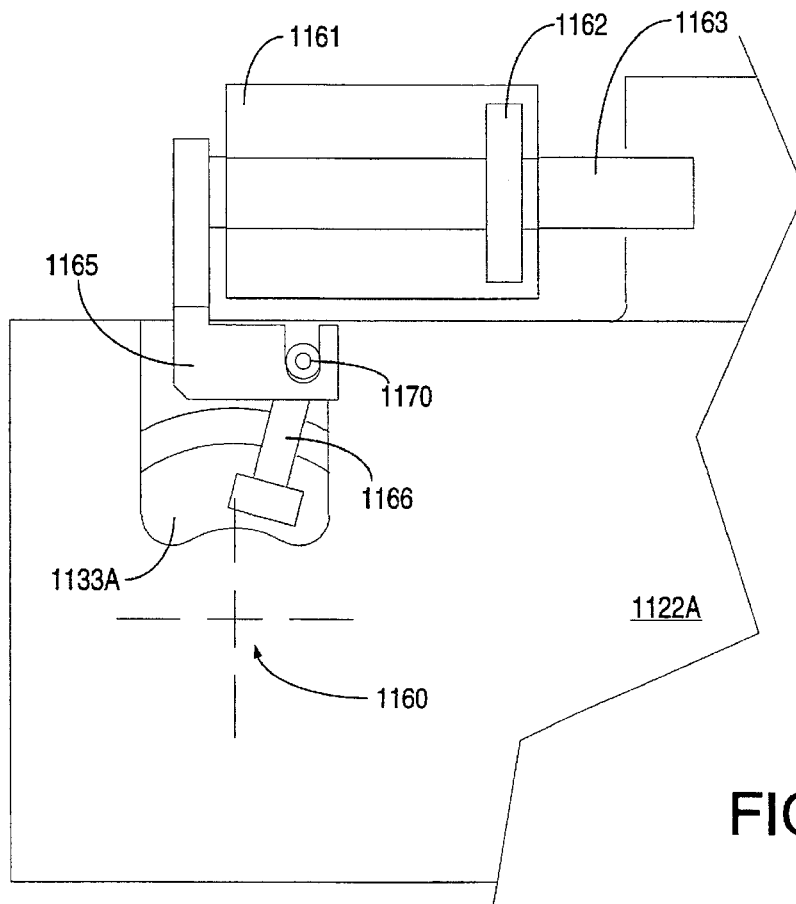
FIG. 22A illustrates a detailed view of the mechanism used to rotate the rotation plate corresponding to the retracted position for the rotation plate.
Figure 22B:
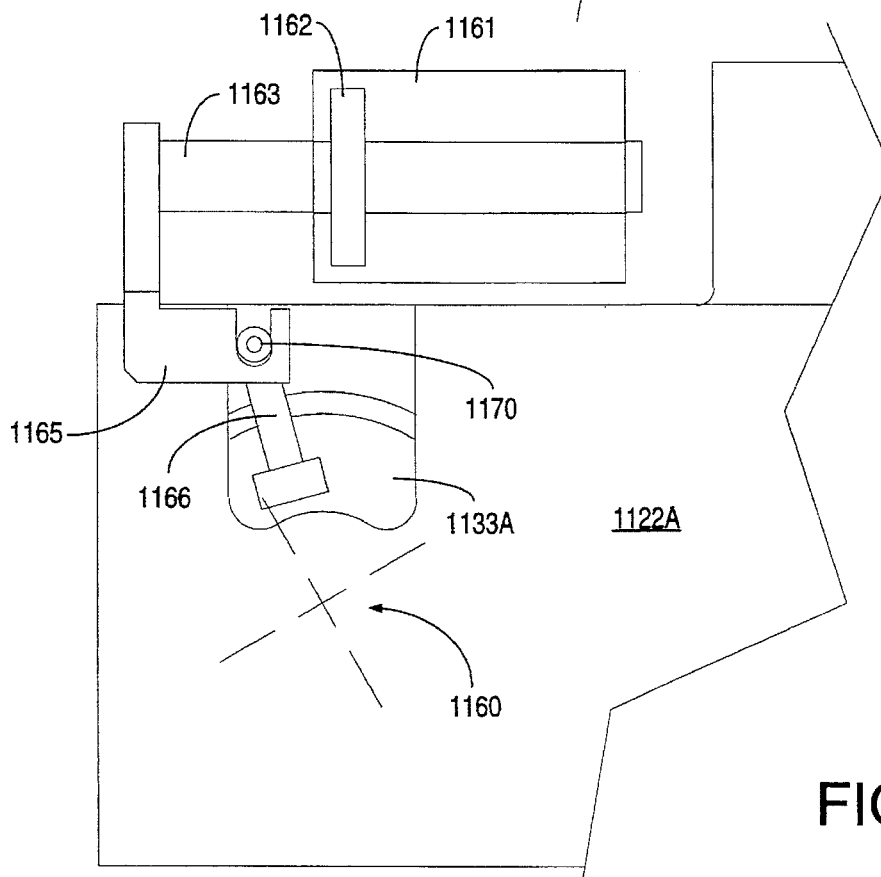
FIG. 22B illustrates a detailed view of the mechanism used to rotate the rotation plate corresponding to the rotated position for the rotation plate.

Further details of this mechanism are illustrated in FIGS. 22A and 22B, which correspond to FIGS. 21A and 21B, respectively. Actuator 1165 contains a slot which constrains a ball bearing 1170 extending from crank 1166. Thus, as piston rod 1163 and actuator 1165 translate from left to right, ball bearing 1170 forms a mechanical linkage which causes rotation plate 1133A to pivot about point 1160. Ball bearing 1170 prevents any sliding contact with the sides of the slot in actuator 1165.

Figure 23A:
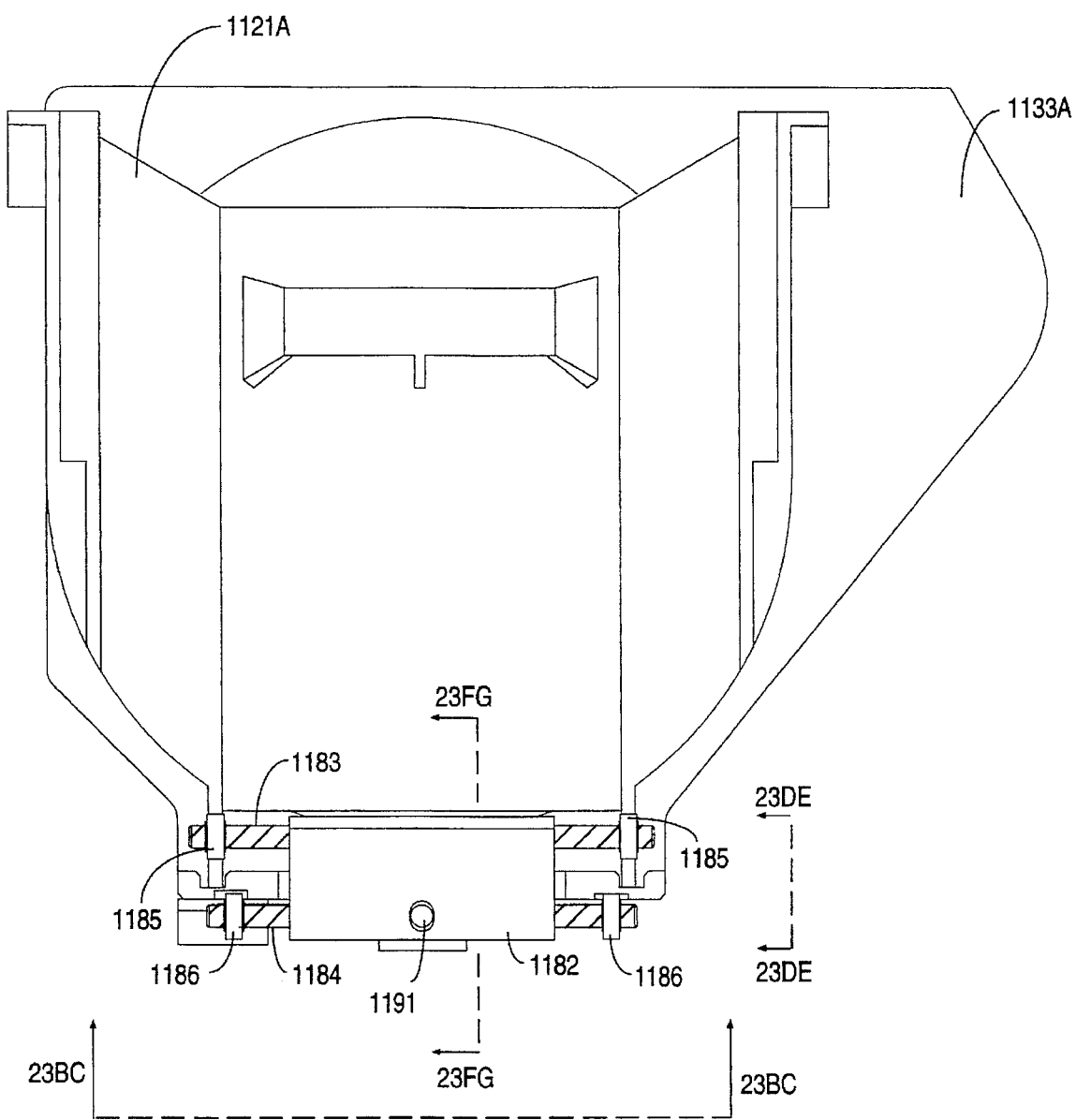
FIG. 23A illustrates a detailed view of the cassette clamp from the direction indicated by the arrows designated 23A in FIG. 19B.

FIG. 19B illustrates generally a clamp 1180 which holds wafer cassette 1121A in position after it is placed in the input/output unit. Clamp 1180 is illustrated in greater detail in FIGS. 23A–23G. FIG. 23A illustrates clamp 1180 from the direction indicated by the arrows 23A in FIG. 19B. In FIG. 23A, the wafers in wafer cassette 1121A are oriented vertically. Clamp 1180 includes a face plate 1182, which is bored to receive shafts 1183 and 1184. Two pairs of rollers 1185 and 1186 are rotatably fitted on shafts 1183 and 1184, respectively.

Figure 23B:
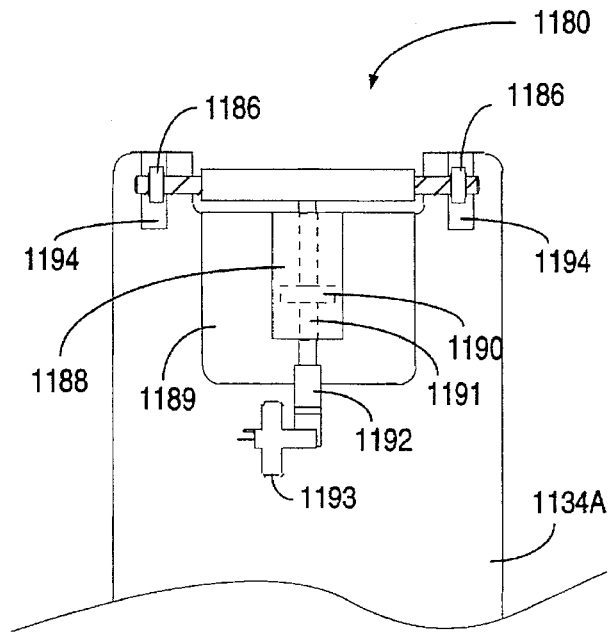
FIG. 23B illustrates a bottom plan view of the cassette clamp in the closed position, taken from the direction indicated by the arrows designated 23BC in FIG. 23A.
Figure 23C:
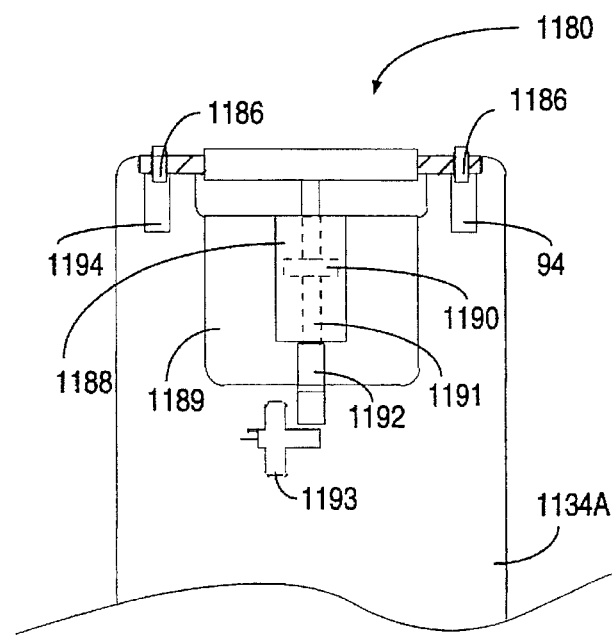
FIG. 23C illustrates a bottom plan view of the cassette clamp in the open position, taken from the direction indicated by the arrows designated 23BC in FIG. 23A.
Figure 23D:
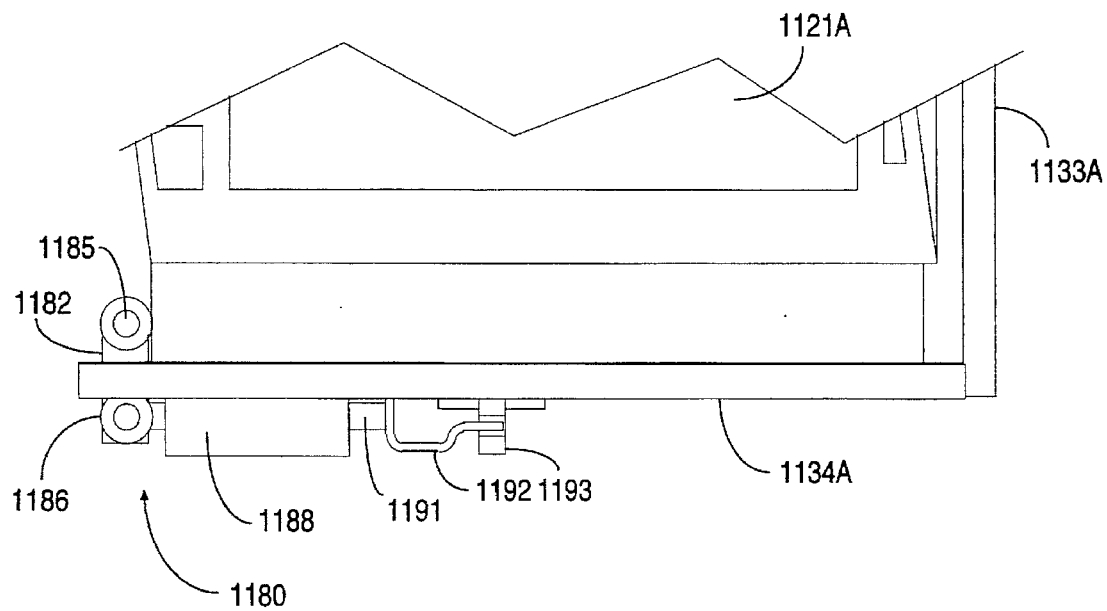
FIG. 23D illustrates a side elevational view of the cassette clamp in the closed position, taken from the direction indicated by the arrows designated 23DE in FIG. 23A.
Figure 23E:
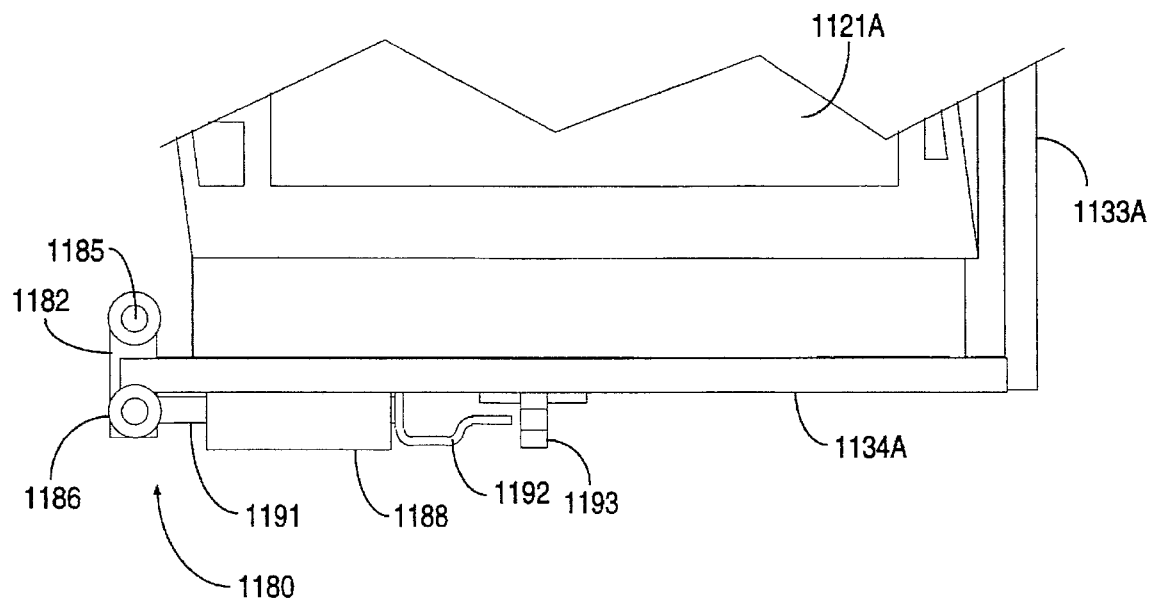
FIG. 23E illustrates a side elevational view of the cassette clamp in the open position, taken from the direction indicated by the arrows designated 23DE in FIG. 23A.
Figure 23F:
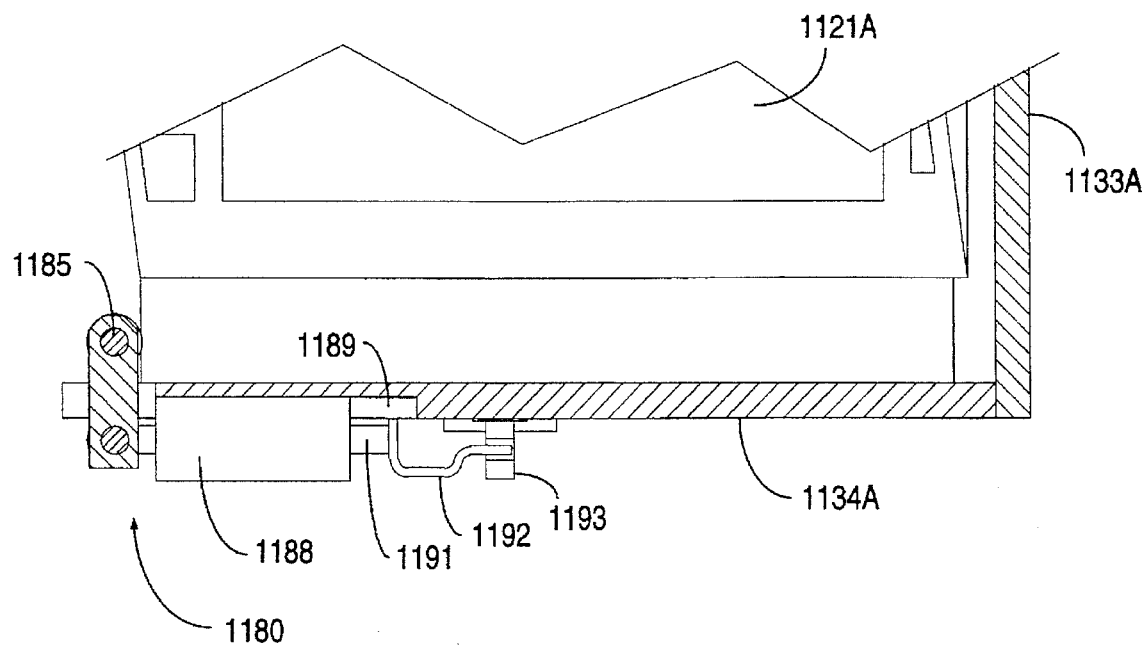
FIG. 23F illustrates a cross-sectional view of the cassette clamp in the closed position, taken at section 23FG—23FG as shown in FIG. 23A.
Figure 23G:
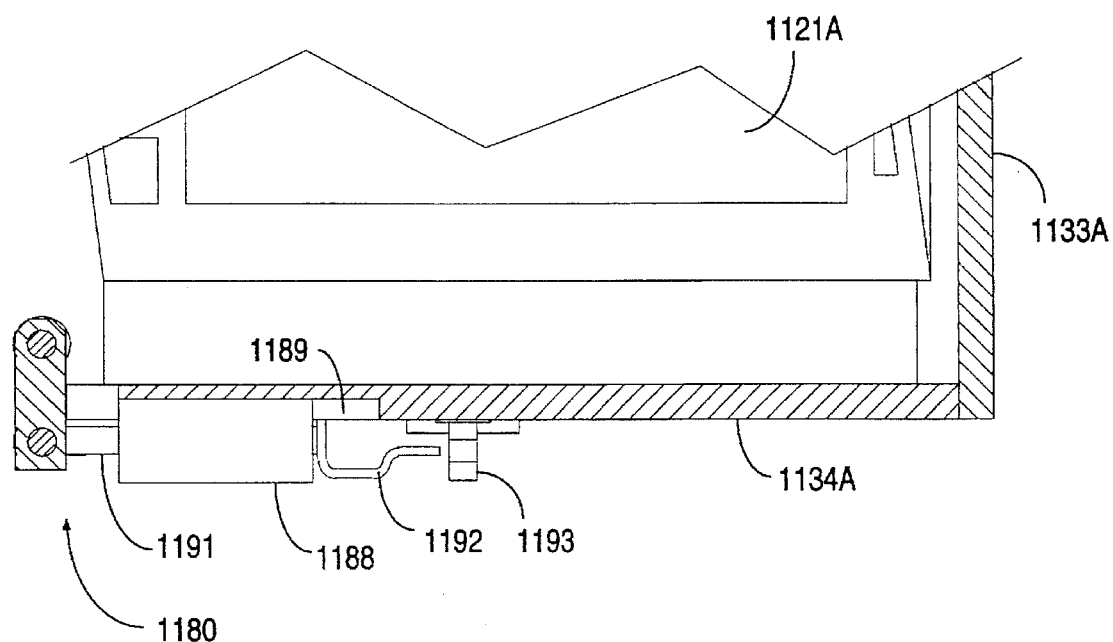
FIG. 23G illustrates a cross-sectional view of the cassette clamp in the open position, taken at section 23FG—23FG as shown in FIG. 23A.

Further details of clamp 1180 are apparent from FIGS. 23B–23G. FIGS. 23B and 23C are bottom plan views taken from the direction indicated by arrows 23BC in FIG. 23A. FIGS. 23D and 23E are side elevational views taken from the direction indicated by the arrows 23DE in FIG. 23A. FIGS. 23F and 23G are cross-sectional views taken at section 23FG—23FG as shown in FIG. 23A. Attached at right angles to rotation plate 1133A is a plate 1134A, on which clamp 1180 is mounted. Plate 1134A is essentially parallel to drawer front 1120A and is therefore in a horizontal position when cassette input/output unit 1111A is open. A spring return air cylinder 1188 is mounted in a recess 1189 on one side of plate 1134A. Recess 1189 is formed in the bottom side of plate 1134A (when the unit is in the open position), and is visible in plan in FIGS. 23B and 23C and in cross section in FIGS. 23F and 23G. Spring return air cylinder 1188 contains a piston 1190 and a piston rod 1191 which protrudes from both ends of air cylinder 1188. Piston 1190 is normally biased to the position shown in FIG. 23B by a spring internal to air cylinder 1188; when pressurized air is introduced to air cylinder 1188, the piston is forced to the position shown in FIG. 23C. One end of piston rod 1191 is fitted firmly into a hole that is bored in face plate 1182. The other end of piston rod 1191 is attached to a flag 1192, which activates a limit switch 1193. As shown in FIGS. 23B and 23C, rollers 1186 ride in slots 1194 which are formed in plate 1133B. This prevents piston rod 1191 from rotating and thereby maintains face plate 1182 in the proper position.

When cassette input/output unit 1111A is open, air pressure is applied to air cylinder 1188 through an air line (not shown) and clamp 1180 is in the open position which is shown in FIGS. 23C, 23E and 23G. After cassette 1121A has been placed in the cassette input/output unit, the pressurized air is released and the internal spring drives piston rod 1191 to the right (from the perspective of FIGS. 23D–23G). As shown in FIGS. 23D and 23F, rollers 1185 come into contact with cassette 1121A, pressing it against rotation plate 1133A. At the same time, flag 1192 projects into limit switch 1193, indicating to the microprocessor that clamp 1180 has been closed. The use of rollers 1185 ensures that there is no sliding friction with cassette 1121A, which might generate particles.

When this process has been completed, cassette 1121A is firmly clamped in place and unit 1111A may be closed. When unit 1111A is opened, air pressure is applied to spring return air cylinder 1188, opening clamp 1180 and allowing the cassette to be removed by the operator.

The cassette input/output units of this invention can be controlled in a variety of ways. As noted above, preferably the opening and closing of the unit is controlled by a microprocessor. In a relatively straightforward embodiment, the operator depresses a button to open or close the unit. In the preferred embodiment, a computer displays symbols or icons representing the various components in the semiconductor processing system. One of the components so displayed is the cassette input/output unit. By clicking on the symbol for the cassette input/output unit, the operator displays virtual buttons which may be depressed to open or close the unit. When an open or close instruction is given, the computer communicates with a microcontroller which controls the components of the cassette input/output unit.

When an instruction is given to open the unit, initially air cylinder 1161 is actuated so as to move rotation tray 1133A to its retracted position. Then motor/encoder 1146 is driven to rotate drawer front 1120A to the open position. Finally, clamp 1180 is actuated to release the cassette. When the instruction to close the unit is given, the same sequence of operations is performed in reverse order.

The cassette input/output unit of this invention is capable of receiving a wafer cassette in the angular orientation it has when normally carried by the operator. Thus, the wrist action required to rotate the cassette with normal input/output units is avoided. The cassette is clamped securely in place as soon as it is placed in the unit. The unit then rotates the cassette to a position in which a robot arm can retrieve wafers from the cassette. If necessary, the cassette can be rotated about a vertical axis to position it properly in relation to the robot. Whether the unit is open or closed, the operator is unable to extend his or her arms into the interior of the photolithography unit.

While a single embodiment according to this invention has been described, it will be apparent that numerous alternative embodiments may be constructed according to the broad principles of this invention. The broad principles of this invention are to be construed as covering all such alternative embodiments. For example, the principles of this invention are applicable to any type of semiconductor processing equipment.

APPENDIX A

All substrates enter the Thermal Process Module 112 in the area of cool plate assembly 128. They are then transferred to the appropriate hot plate assembly/assemblies 124 and/or 126 and cool plate assembly 128 by transfer arms 208 and 210. The Thermal Process Module is capable of processing 2 substrates at the same time in either a parallel or a serial fashion. Parallel operation is characterized by alternating the hot plate assembly used to bake each substrate. The first substrate will be baked in hot plate assembly 124 and cooled on cool plate assembly 128. The next substrate will be baked in hot plate assembly 126 and cooled on the cool plate assembly 128. Serial operation is characterized by baking all substrates first in hot plate assembly 124, then in hot plate assembly 126 and finally cooling on cool plate assembly 128.

As each substrate is entered into Thermal Process Module 112, the control software calculates the time in the future that the substrate will have completed the baking steps and therefore need to be cooled. If any previous substrate is expected to be on cool plate 128 at that time, the control software will delay the transfer of the current substrate to hot plate assembly 124 or 126 until such time that cool plate assembly 128 is expected to be available when the current substrate will have completed the baking steps.

Idle Condition of the Thermal Process Module (TPM)

Hot plate assembly oven covers 801 closed

Hot plate assemblies at the correct temperature

All lift pins 206 in each assembly are in down position within lift pin holes 207 of their assembly Both transfer arms 208 and 210 are in their home positions between hot plate assemblies 124 or 126 and cool plate assembly 128

No substrates are in the TPM

Normal Operation Sequence: Parallel Operation

1. Transfer arm 208 moves over cool plate assembly 128 and turns on vacuum
2. Substrate 1 is entered into the TPM and placed on transfer arm 208
3. Oven cover 801 of hot plate assembly 124 is lifted
4. Transfer arm 208 moves to hot plate assembly 124
5. Transfer arm 208 turns vacuum off
6. Pins 206 of hot plate assembly 124 raise up (to the half inch position) and lift substrate 1 off of transfer arm 208
7. Transfer arm 208 moves to its home position between hot plate assembly 124 and cool plate assembly 128
8. Hot plate assembly 124 turns vacuum hold-down on
9. Pins 206 of hot plate assembly 124 lower substrate 1 onto the thermal surface of the hot plate
10. Oven cover 801 of hot plate assembly 124 is lowered and shut Some Time Later 11. Transfer arm 208 moves over cool plate assembly 128 and turns on vacuum
12. Substrate 2 is entered into the TPM and placed on transfer arm 208
13. Wait for proper time
14. Oven cover 801 of hot plate assembly 126 is lifted
15. Transfer arm 208 moves to hot plate assembly 126
16. Transfer arm 208 turns vacuum off
17. Pins 206 of hot plate assembly 126 raise up (to the half inch position) and lift substrate 2 off of transfer arm 208
18. Transfer arm 208 moves to its home position between hot plate assembly 126 and cool plate assembly 128
19. Hot plate assembly 126 turns vacuum hold-down on
20. Pins 206 of hot plate assembly 126 lower substrate 2 onto the thermal surface of the hot plate
21. Oven cover 801 of hot plate assembly 126 is lowered and shut When Hot Plate Assembly 124 is Finished Baking Substrate 1:

22. Oven cover 801 of hot plate assembly 124 is lifted
23. Hot plate assembly 124 turns vacuum hold-down off
24. Pins 206 of hot plate assembly 124 lift substrate 1 up to the lower transfer position (quarter inch position)
25. Transfer arm 210 moves under substrate 1 and turns on its vacuum
26. Pins 206 of hot plate assembly 124 lower substrate 1 onto transfer arm 210
27. Transfer arm 210 moves to the cool plate assembly 128
28. Transfer arm 210 turns vacuum off
29. Pins 206 of cool plate assembly 128 raise up (to the half inch position) and lift substrate 1 off of transfer arm 210
30. Transfer arm 210 moves to its home position between hot plate assembly 124 and cool plate assembly 128
31. Cool plate assembly 128 turns vacuum hold-down on
32. Pins 206 of cool plate assembly 128 lower substrate 1 onto the thermal surface of the chill plate After Cool Plate Assembly 128 is Finished Cooling Substrate 1:

33. Cool plate assembly 128 turns vacuum hold-down off
34. Pins 206 of cool plate assembly 128 raise substrate 1 up to the robot transfer position
35. Substrate 1 is removed from the Thermal Process Module at cool plate assembly 128

When Hot Plate Assembly 126 is Finished Baking Substrate 2:

36. Oven cover 801 of hot plate assembly 126 is lifted
37. Hot plate assembly 126 turns vacuum hold-down off
38. Pins 206 of hot plate assembly 126 lift substrate 2 up to the lower transfer position (quarter inch position)
39. Transfer arm 210 moves under substrate 2 and turns on its vacuum
40. Pins 206 of hot plate assembly 126 lower substrate 2 onto transfer arm 210
41. Transfer arm 210 moves to the cool plate assembly 128
42. Transfer arm 210 turns vacuum off
43. Pins 206 of cool plate assembly 128 raise up (to the half inch position) and lift substrate 2 off of transfer arm 210
44. Transfer arm 210 moves to its home position between hot plate assembly 124 and cool plate assembly 128
45. Cool plate assembly 128 turns vacuum hold-down on
46. Pins 206 of cool plate assembly 128 lower substrate 2 onto the thermal surface of the chill plate After Cool Plate Assembly 128 is Finished Cooling Substrate 2:

47. Cool plate assembly 128 turns vacuum hold-down off
48. Pins 206 of cool plate assembly 128 raise substrate 2 up to the robot transfer position
49. Substrate 2 is removed from the Thermal Process Module at cool plate assembly 128

The control software schedules all substrate transfers in order to ensure that there are no transfer conflicts and that every substrate can get to cool plate assembly 128 as soon as it has completed its baking. If there is a delay in removing a substrate from Thermal Process Module 112 and the next substrate is finished baking and is ready to transfer to cool plate assembly 128, the first substrate is placed on transfer arm 208 and held in this buffer position. This allows the second substrate to be transferred to cool plate assembly 128 with transfer arm 210 which can pass under transfer arm 208 while carrying the second substrate.

Normal Operation Sequence: Serial Operation

1. Transfer arm 208 moves over cool plate assembly 128 and turns on vacuum
2. Substrate 1 is entered into the TPM and placed on transfer arm 208
3. Oven cover 801 of hot plate assembly 124 is lifted
4. Transfer arm 208 moves to hot plate assembly 124
5. Transfer arm 208 turns vacuum off
6. Pins 206 of hot plate assembly 124 raise up (to the half inch position) and lift substrate 1 off of transfer arm 208
7. Transfer arm 208 moves to its home position between hot plate assembly 124 and cool plate assembly 128
8. Hot plate assembly 124 turns vacuum hold-down on
9. Pins 206 of hot plate assembly 124 lower substrate 1 onto the thermal surface of the hot plate
10. Oven cover 801 of hot plate assembly 124 is lowered and shut When Hot Plate Assembly 124 is Finished Baking Substrate 1:

11. Oven cover 801 of hot plate assembly 124 is lifted
12. Hot plate assembly 124 turns vacuum hold-down off
13. Pins 206 of hot plate assembly 124 lift substrate 1 up to the upper transfer position (half inch position)
14. Transfer arm 208 moves under substrate 1 and turns on its vacuum
15. Pins 206 of hot plate assembly 124 lower substrate 1 onto transfer arm 208
16. Oven cover 801 of hot plate assembly 126 is lifted
17. Transfer arm 208 moves to hot plate assembly 126
18. Transfer arm 208 turns vacuum off
19. Pins 206 of hot plate assembly 126 raise up (to the half inch position) and lift substrate 1 off of transfer arm 208
20. Transfer arm 208 moves to its home position between hot plate assembly 126 and cool plate assembly 128
21. Hot plate assembly 126 turns vacuum hold-down on
22. Pins 206 of hot plate assembly 126 lower substrate 1 onto the thermal surface of the hot plate
23. Oven cover 801 of hot plate assembly 126 is lowered and shut Some Time Later:

24. Transfer arm 208 moves over cool plate assembly 128 and turns on vacuum
25. Substrate 2 is entered into the TPM and placed on transfer arm 208
26. Wait for proper time
27. Oven cover 801 of hot plate assembly 124 is lifted
28. Transfer arm 208 moves to hot plate assembly 124
29. Transfer arm 208 turns vacuum off
30. Pins 206 of hot plate assembly 124 raise up (to the half inch position) and lift substrate 2 off of transfer arm 208
31. Transfer arm 208 moves to its home position between hot plate assembly 124 and cool plate assembly 128
32. Hot plate assembly 124 turns vacuum hold-down on
33. Pins 206 of hot plate assembly 124 lower substrate 2 onto the thermal surface of the hot plate
34. Oven cover 801 of hot plate assembly 124 is lowered and shut When Hot Plate Assembly 126 is Finished Baking Substrate 1:

35. Oven cover 801 of hot plate assembly 126 is lifted
36. Hot plate assembly 126 turns vacuum hold-down off
37. Pins 206 of hot plate assembly 126 lift substrate 1 up to the lower transfer position (quarter inch position)
38. Transfer arm 210 moves under substrate 1 and turns on its vacuum
39. Pins 206 of hot plate assembly 126 lower substrate 1 onto transfer arm 210
40. Transfer arm 210 moves to the cool plate assembly 128
41. Transfer arm 210 turns vacuum off
42. Pins 206 of cool plate assembly 128 raise up (to half inch position) and lift substrate 1 off of transfer arm 210
43. Transfer arm 210 moves to its home position between hot plate assembly 124 and cool plate assembly 128
44. Cool plate assembly 128 turns vacuum hold-down on
45. Pins 206 of cool plate assembly 128 lower substrate 1 onto the thermal surface of the chill plate When Hot Plate Assembly 124 is Finished Baking Substrate 2:

46. Oven cover 801 of hot plate assembly 124 is lifted
47. Hot plate assembly 124 turns vacuum hold-down off
48. Pins 206 of hot plate assembly 124 lift substrate 2 up to the upper transfer position (half inch position)
49. Transfer arm 208 moves under substrate 2 and turns on its vacuum
50. Pins 206 of hot plate assembly 124 lower substrate 2 onto transfer arm 208
51. Oven cover 801 of hot plate assembly 126 is lifted
52. Transfer arm 208 moves to hot plate assembly 126
53. Transfer arm 208 turns vacuum off
54. Pins 206 of hot plate assembly 126 raise up (to half inch position) and lift substrate 2 off of transfer arm 208
55. Transfer arm 208 moves to its home position between hot plate assembly 126 and cool plate assembly 128
56. Hot plate assembly 126 turns vacuum hold-down on
57. Pins 206 of hot plate assembly 126 lower substrate 2 onto the thermal surface of the hot plate
58. Oven cover 801 of hot plate assembly 126 is lowered and shut After Cool Plate Assembly 128 is Finished Cooling Substrate 1:

59. Cool plate assembly 128 turns vacuum hold-down off
60. Pins 206 of cool plate assembly 128 raise substrate 1 up to the robot transfer position
61. Substrate 1 is removed from the Thermal Process Module at cool plate assembly 128

When Hot Plate Assembly 126 is Finished Baking Substrate 2:

62. Oven cover 801 of hot plate assembly 126 is lifted
63. Hot plate assembly 126 turns vacuum hold-down off
64. Pins 206 of hot plate assembly 126 lift substrate 2 up to the lower transfer position (quarter inch position)
65. Transfer arm 210 moves under substrate 2 and turns on its vacuum
66. Pins 206 of hot plate assembly 126 lower substrate 2 onto transfer arm 210
67. Transfer arm 210 moves to the cool plate assembly 128
68. Transfer arm 210 turns vacuum off
69. Pins 206 of cool plate assembly 128 raise up (to half inch position) and lift substrate 2 off of transfer arm 210
70. Transfer arm 210 moves to its home position between hot plate assembly 124 and cool plate assembly 128
71. Cool plate assembly 128 turns vacuum hold-down on 72. Pins 206 of cool plate assembly 128 lower substrate 2 onto the thermal surface of the cool plate After Cool Plate Assembly 128 is Finished Cooling Substrate 2:

73. Cool plate assembly 128 turns vacuum hold-down off
74. Pins 206 of cool plate assembly 128 raise substrate 2 up to the robot transfer position
75. Substrate 2 is removed from the Thermal Process Module at cool plate assembly 128

The control software schedules all substrate transfers in order to ensure that there are no transfer conflicts and that every substrate can get to cool plate assembly 128 as soon as it has completed its baking. If there is a delay in removing a substrate from Thermal Process Module 112 and the next substrate is finished baking and is ready to transfer to cool plate assembly 128, the first substrate is placed on transfer arm 208 in a buffer position. This allows the second substrate to be transferred to cool plate assembly 128 with transfer arm 210 which can pass under transfer arm 208 while carrying the second substrate.

We claim:

1. A photolithography system comprising:
    at least one resist coating unit capable of applying a photoresist layer to a substrate;
    at least one thermal process module capable of heating and cooling said substrate, said thermal process module comprising at least one hot plate assembly, at least one cool plate assembly, and at least one transfer arm capable of sufficient motion to transfer said substrate between an area substantially above said hot plate assembly and an area substantially above said cool plate assembly, said motion being insufficient to transfer said substrate to said resist coating unit; and
    at least one substrate handling robot pivotable about an axis which is stationary with respect to said photolithography system, said robot being capable of delivering a substrate to or retrieving a substrate from said at least one resist coating unit and said at least one thermal process module.

2. The system of claim 1 further comprising at least one developing unit capable of developing said applied photoresist layer.

3. The system of claim 1 comprising at least one substrate cassette input/output unit capable of receiving said substrate from outside said photolithography system,
    wherein said motion of said at least one transfer arm is insufficient to transfer a substrate between said cassette input/output unit, said thermal process module and said resist coating unit; and
    further wherein said robot is capable of delivering substrate to or retrieving a substrate from said at least one substrate cassette input/output unit, said at least one resist coating unit and said at least one thermal process module.

4. The system of claim 1 wherein said at least one substrate handling robot has three degrees of freedom and said at least one transfer arm has only a single degree of freedom.

5. The system of claim 4 wherein said at least one robot includes a double end effector.

6. A photolithography system comprising:
    at least one developing unit;
    at least one thermal process module capable of heating and cooling a substrate, said thermal process module comprising at least one hot plate assembly, at least one cool plate assembly, and at least one transfer arm capable of sufficient motion to transfer said substrate between an area substantially above said hot plate assembly and an area substantially above said cool plate assembly, said motion being insufficient to transfer said substrate to said developing unit; and
    at least one substrate handling robot pivotable about an axis which is stationary with respect to said photolithography system, said robot being capable of delivering a substrate to or retrieving a substrate from said at least one developing unit and said at least one thermal process module.

7. The system of claim 6 wherein said at least one substrate handling robot has three degrees of freedom and said at least one transfer arm has only a single degree of freedom.

8. The system of claim 7 wherein said at least one robot includes a double end effector and said transfer arm is devoid of a double end effector.

9. A method of transferring a substrate from a resist coating machine to a hot plate assembly in a thermal process module, said method comprising the steps of:
    providing a robot, said robot being rotatable about an axis which is stationary with respect to said photolithography system, said robot having an arm capable of raising or lowering said substrate;
    providing a transfer arm within said thermal process module, said transfer arm being translatable along a straight line, said transfer arm's motion being insufficient to transfer said substrate to said resist coating machine;
    causing said robot to retrieve said substrate from said resist coating machine;
    causing said robot to rotate about said axis;
    causing said robot to place said substrate on said transfer arm; and
    causing said transfer arm to move said substrate to an area substantially above said hot plate assembly.

10. The method of claim 9 further comprising the steps of:
    causing said substrate to be transferred to said hot plate assembly;
    baking said substrate; and
    causing said substrate to be transferred from said hot plate assembly to said transfer arm.

11. The method of claim 10 wherein said thermal process module further comprising a cool plate assembly, the method further comprising the steps of:
    causing said transfer arm to move said substrate from said area substantially above said hot plate assembly to an area substantially above said cool plate assembly;
    causing said substrate to be transferred from said transfer arm to said cool plate assembly; and
    cooling said substrate.

12. The method of claim 11 further comprising the steps of:
    causing said substrate to be transferred from said cool plate assembly to said transfer arm;
    holding said substrate on said transfer arm; and
    cooling another substrate on said cool plate assembly during said step of holding.

13. The method of claim 11 further comprising the step of:
    starting said step of baking at a time such that said cool plate assembly is available for said step of cooling on completion of said step of baking.

14. A photolithography system comprising:

a resist coating unit capable of applying a photoresist layer to a substrate;

a thermal process module capable of heating and cooling said substrate; and a cassette input/output unit capable of receiving said substrate from outside said photolithography system, wherein said cassette input/output unit comprises:

a drawer front;

a motor;

a drive mechanism coupled to said motor and said drawer front for moving said drawer front between an open and a closed position, said drawer front being oriented substantially vertically when in said closed position and substantially horizontally when in said open position and rotating approximately 90 degrees about a horizontal axis as said drawer front is moved from said closed position to said open position; and a drawer bottom rigidly connected to and oriented at a right angle to said drawer front; and a clamp positioned within said input/output unit for holding a cassette containing semiconductor wafers or other substrates inside said cassette input/output unit as said drawer front rotates between said open and closed positions and while said drawer front is in said closed position; and a substrate handling robot pivotable about an axis which is stationary with respect to said photolithography system, wherein said robot is capable of delivering a substrate to or retrieving a substrate from said cassette input/output unit, said resist coating unit and said thermal process module.

15. The system of claim 14 wherein said clamp comprises a roller.

16. The system of claim 14 wherein said motor comprises a motor/encoder.

17. The system of claim 14 wherein said drawer front prevents access to an interior of the semiconductor processing system when said drawer front is in said closed position and said drawer bottom prevents access to the interior of the semiconductor processing system when said drawer front is in said open position.

18. The system of claim 14 further comprising a cabinet enclosing said cassette input/output unit, said cabinet comprising a vertical wall, said vertical wall having an opening suitable to accommodate said drawer front when in said closed position, said drawer front preventing access to an interior of said cabinet and said opening being suitable to accommodate said drawer bottom when said drawer front is in said open position, said drawer bottom preventing access to an interior of said cabinet when said drawer front is in said open position.

19. The system of claim 14 wherein said drive mechanism comprises:

a slider, one end of said slider being pivotally attached to a side of said cassette input/output unit, said cassette input/output unit side being joined to said drawer front; and a slide rail, said slider being mounted to slide along said slide rail, said slider being driven by said motor.

20. The system of claim 14, wherein said thermal process module comprises a hot plate assembly, a cool plate assembly, and an internal transfer arm capable of transferring said substrate between an area substantially above said hot plate assembly and an area substantially above said cool plate assembly but not capable of transferring said substrate to said resist coating unit or to said cassette input/output unit.

21. The system of claim 14 comprising a rotation plate adjacent said drawer bottom, said rotation plate pivotable about an axis perpendicular to said drawer bottom.

22. The system of claim 21 further comprising a flag which indicates that said clamp is closed.

23. The system of claim 21 further comprising a mechanism for rotating said rotation plate, said mechanism comprising a ball bearing.

* * * * *

UNITED STATES PATENT AND TRADEMARK OFFICE
CERTIFICATE OF CORRECTION

PATENT NO. : 5,651,823
DATED : July 29, 1997
INVENTOR(S) : Parodi, Michael L.; Biche, Michael R.; Anderson, H. Alexander It is certified that error appears in the above-identified patent and that said Letters Patent is hereby corrected as shown below:

Column 17, line 17, delete "rotatee" and insert --rotate--.

Signed and Sealed this

Seventeenth Day of March, 1998

Attest:

BRUCE LEHMAN

Attesting Officer

Commissioner of Patents and Trademarks